(12) United States Patent
Takazaki

(10) Patent No.: US 9,448,535 B2
(45) Date of Patent: *Sep. 20, 2016

(54) RIGID DECORATIVE MEMBER HAVING WHITE RIGID COATING LAYER, AND METHOD FOR PRODUCING THE SAME

(71) Applicants: CITIZEN HOLDINGS CO., LTD., Nishitokyo-shi, Tokyo (JP); CITIZEN WATCH CO., LTD., Nishitokyo-shi, Tokyo (JP)

(72) Inventor: Koutarou Takazaki, Sayama (JP)

(73) Assignees: CITIZEN HOLDINGS CO., LTD., Tokyo (JP); CITIZEN WATCH CO., LTD., Tokyo (JP)

( * ) Notice: Subject to any disclaimer, the term of this patent is extended or adjusted under 35 U.S.C. 154(b) by 15 days.

This patent is subject to a terminal disclaimer.

(21) Appl. No.: 14/386,179
(22) PCT Filed: Mar. 12, 2013
(86) PCT No.: PCT/JP2013/056807
§ 371 (c)(1),
(2) Date: Sep. 18, 2014
(87) PCT Pub. No.: WO2013/141081
PCT Pub. Date: Sep. 26, 2013

(65) Prior Publication Data
US 2015/0072138 A1    Mar. 12, 2015

(30) Foreign Application Priority Data
Mar. 19, 2012 (JP) .................... 2012-062247

(51) Int. Cl.
C23C 14/06 (2006.01)
G04B 37/22 (2006.01)
C23C 14/00 (2006.01)

(52) U.S. Cl.
CPC ......... *G04B 37/223* (2013.01); *C23C 14/0015* (2013.01); *C23C 14/0021* (2013.01); *C23C 14/0635* (2013.01); *C23C 14/0641* (2013.01); *Y10T 428/265* (2015.01)

(58) Field of Classification Search
USPC .................. 204/192; 428/336, 697, 698, 699
See application file for complete search history.

(56) References Cited

U.S. PATENT DOCUMENTS 4,422,874 A   12/1983  Nishimura et al.
9,120,933 B2 *  9/2015  Takazaki ............. C23C 14/0015
(Continued)

FOREIGN PATENT DOCUMENTS

CN    100488677 C   5/2009
CN    101802267 A   8/2010
(Continued)

OTHER PUBLICATIONS

International Search Report of PCT/JP2013/056807 dated May 7, 2013 [PCT/ISA/210].
(Continued)

*Primary Examiner* — Archene Turner
(74) *Attorney, Agent, or Firm* — Sughrue Mion, PLLC

(57) ABSTRACT

A rigid decorative member of the present invention is a rigid decorative member comprising a base and a rigid coating layer laminated on or above the base, wherein the rigid coating layer comprises a reaction compound of raw metal, in which a metal M1 and a metal M2, and in addition, selectively a metal M3 are combined, and of a non-metallic element selected from one or two or more of nitrogen, carbon, and oxygen, or comprises an alloy in which a metal M1 and a metal M2, and in addition, selectively a metal M3 are combined; the metal M1 is selected from one or two of Mo and W; the metal M2 is selected from one or two or more of Nb, Ta, and V; and the metal M3 is selected from one or two or more of Cr, Ti, Hf, and Zr.

9 Claims, 21 Drawing Sheets

(56) References Cited

U.S. PATENT DOCUMENTS

| | | |
|---|---|---|
| 2004/0093730 A1 | 5/2004 | Miya et al. |
| 2009/0087634 A1 | 4/2009 | Naoi et al. |
| 2010/0018250 A1 | 1/2010 | Miya et al. |
| 2010/0227156 A1 | 9/2010 | Satoh et al. |
| 2015/0044508 A1 | 2/2015 | Takazaki |

FOREIGN PATENT DOCUMENTS

| | | |
|---|---|---|
| EP | 1482076 A1 | 12/2004 |
| JP | 54-085214 A | 7/1979 |
| JP | 58136743 A | 8/1983 |
| JP | 07-216559 A | 8/1995 |
| JP | 2000-219977 A | 8/2000 |
| JP | 2004-043959 A | 2/2004 |
| JP | 2006-256902 A | 9/2006 |
| JP | 2007-262472 A | 10/2007 |
| JP | 2011-256424 A | 12/2011 |
| JP | 2013194284 A | 9/2013 |

OTHER PUBLICATIONS

Communication dated Oct. 8, 2015 from the European Patent Office issued in corresponding application No. 13764377.1.

* cited by examiner

RIGID DECORATIVE MEMBER HAVING WHITE RIGID COATING LAYER, AND METHOD FOR PRODUCING THE SAME

CROSS REFERENCE TO RELATED APPLICATIONS

This is a National Stage of International Application No. PCT/JP2013/056807 filed Mar. 12, 2013 (claiming priority based on Japanese Patent Application No. 2012-062247 filed Mar. 19, 2012), the contents of which are incorporated herein by reference in their entirety.

TECHNICAL FIELD

The present invention relates to a rigid decorative member having a white rigid coating layer and to a method for producing the rigid decorative member.

BACKGROUND ART

A platinum coating having high brightness has been conventionally formed on the outermost layer of an abrasion-resistant layer for improving the scratch resistance of exterior parts, ornaments such as glasses, accessories, and watches, decorative trims, sporting goods, and the like in order to make a high-grade appearance. For example, in Patent Literature 1, an undercoat layer is formed on a base, a titanium carbide layer is formed on the surface thereof by a dry plating method, and a decorative coating layer comprising platinum or a platinum alloy formed by a dry plating method is formed on the surface thereof. However, it has been necessary to thinly form the film since the platinum layer as the outermost layer has been expensive; and it has been necessary to make the titanium carbide layer to have a pale color in order to suppress color change due to peeling of the thin platinum layer. Therefore, the hardness of the titanium carbide layer has been low (about 40%) compared to the hardness of a typical titanium carbide layer, and it has been impossible to obtain sufficient scratch resistance.

Further, when hardness is increased by increasing the amount of carbon allowed to react with the titanium carbide layer in order to improve scratch resistance, a color tone is darkened although the scratch resistance is improved. Further, there is a problem that peeling of a film due to increasing film stress and pitting corrosion in a corrosion resistance test are prone to occur when the film thickness of the titanium carbide layer which is a hardened layer is increased in order to similarly improve scratch resistance. Thus, it has been difficult to form the film having a film thickness of 1.0 µm or more.

Furthermore, there has been a problem that a platinum-based coating causes an allergy by bringing the coating into contact with the human skin.

CITATION LIST

Patent Literature

Patent Literature 1: JPA 2004-043959
Patent Literature 2: JPA 2007-262472

SUMMARY OF INVENTION

Technical Problem

Thus, it has been proposed to use a Mo coating having good brightness, a good color tone, and a good low-splash property, having scratch resistance, and having a high grade instead of the platinum-based coating as the outermost layer. However, there is a concern that it is impossible to use the Mo coating without being processed since the Mo coating has low corrosion resistance. Although it has been proposed to use a Cr coating having good brightness, a good color tone, and a good low-splash property, and having a high grade, there is a concern that the Cr coating has low film hardness, resulting in insufficient scratch resistance, and it is difficult to peel the Cr coating in a production step since the Cr coating has very high corrosion resistance.

On the other hand, it has been proposed to use, as the outermost layer, a Nb carbide film or a Ta carbide film having high hardness and having corrosion resistance. However, there is a concern that it is also impossible to use the coatings without being processed since the coatings have low adhesion to a base, low scratch resistance due to the impossibility of allowing a film thickness to be large, and also low brightness.

Accordingly, an object of the invention is to provide a rigid decorative member in which scratch resistance is significantly improved, and deterioration of appearance quality due to a scratch, abrasion, or the like is suppressed, and which has a white rigid coating layer having a high-grade color tone. Furthermore, there is supplied a product of which the film hardness, scratch resistance performance, abrasion resistance performance, color tones such as brightness and color saturation, corrosion resistance performance, etching performance, and allergy performance are desirably controlled.

Solution to Problem

The rigid decorative member according to the present invention is a rigid decorative member comprising a base and a rigid coating layer laminated on or above the base, wherein the rigid coating layer comprises a reaction compound of raw metal, in which a metal M1 and a metal M2, and in addition, selectively a metal M3 are combined, and of a non-metallic element selected from one or two or more of nitrogen, carbon, and oxygen, or comprises an alloy in which a metal M1 and a metal M2, and in addition, selectively a metal M3 are combined; the metal M1 is selected from one or two of Mo and W; the metal M2 is selected from one or two or more of Nb, Ta, and V; and the metal M3 is selected from one or two or more of Cr, Ti, Hf, and Zr.

Advantageous Effects of Invention

In accordance with the present invention, there is obtained a rigid decorative member in which deterioration of appearance quality due to a scratch, abrasion, or the like is suppressed, and which has a white rigid coating layer having a high-grade color tone. Furthermore, there can be provided a product of which the film hardness, scratch resistance performance, abrasion resistance performance, color tones such as brightness and color saturation, corrosion resistance performance, etching performance, and allergy performance are desirably controlled.

DESCRIPTION OF EMBODIMENTS

Figure 1:
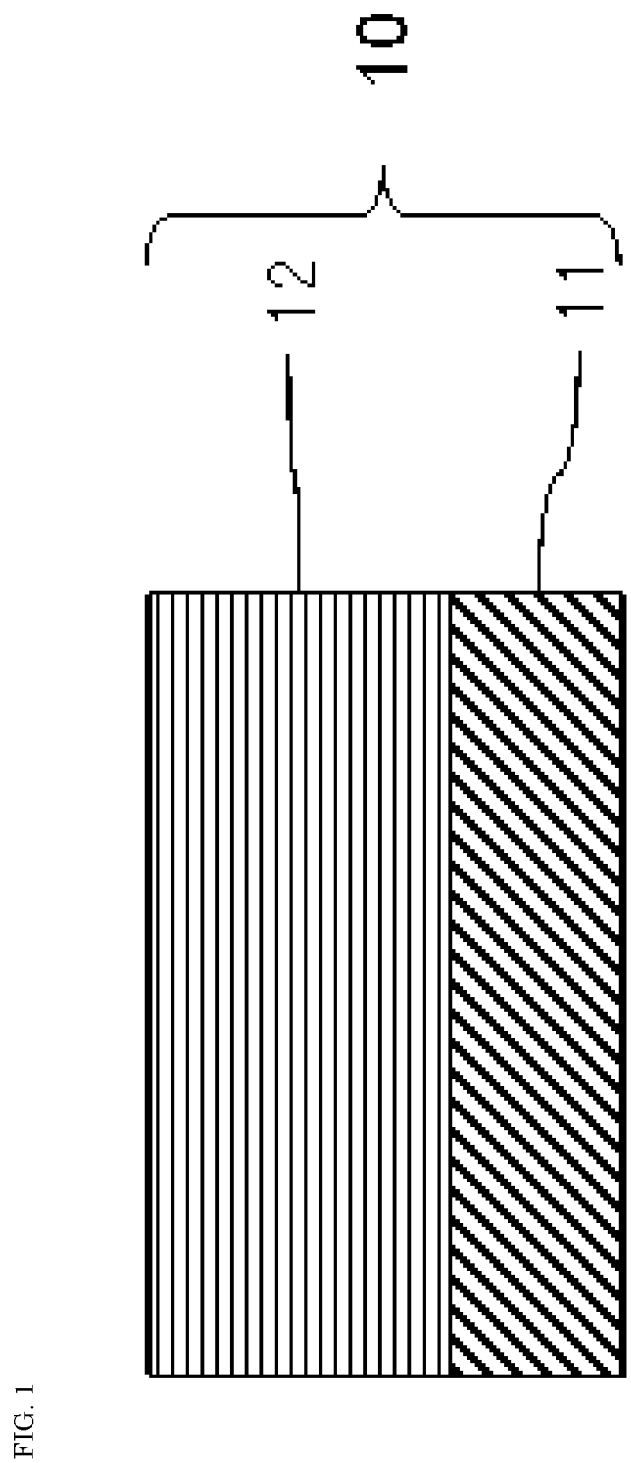
FIG. 1 illustrates a cross-sectional schematic view illustrating an example of the structure of the rigid decorative member of the present invention.

A rigid decorative member illustrated in FIG. 1 will be explained as an embodiment of the present invention in detail below.

<Rigid Decorative Member>

The rigid decorative member of the present invention includes a base and a rigid coating layer laminated on or above the base, and the appearance color of the rigid coating layer is a white color or a stainless steel color. The cross-sectional schematic view of FIG. 1 is one example of the structure of the rigid decorative member of the present invention, and, for example, the rigid decorative member 10 may be a member in which a rigid coating layer 12 comprising a nitride of a MoNb alloy is formed on a surface of an SUS316L base 11 as the base.

A film based on an alloy is employed, whereby the rigid decorative member of the present invention has a characteristic in that adhesion performance, film hardness, scratch resistance performance, abrasion resistance performance, color tone, corrosion resistance performance, etching performance, and allergy performance can be freely controlled by the proportion of each metal included in the alloy.

The hardness, brightness, and color saturation of the rigid decorative member can be changed depending on a desired property. For example, when the rigid coating layer contains a nitride of an alloy, adjustment to a nitrogen content at which the maximum hardness is exhibited may be performed in a case in which scratch resistance is desired, while, in a case in which high brightness is desired, adjustment to a nitrogen content depending on the high brightness may be performed.

Since the hardness of the rigid decorative member is higher than hardness of the film of each metal included in the alloy when nitrogen is not contained, the member can be used even in a single alloy film that is not allowed to react with a nitrogen gas, and the rigid decorative member exhibiting high brightness is obtained in this case.

In such a manner, the problems of the conventional art are solved in the white rigid decorative member of the present invention.

[Base]

Examples of the base 11 include bases formed of metals or ceramic. Specific examples of metals (including alloys) include stainless steel, titanium, titanium alloy, copper, copper alloy, tungsten, or stainless steel, titanium, and titanium alloy subjected to hardening treatment, and the like. The metals may be used singly or in combination of two or more kinds. Further, the shape of the base 11 is not limited.

[Rigid Coating Layer]

The rigid coating layer 12 may be an embodiment (Embodiment (1)) including a reaction compound of raw metal, in which a metal M1 and a metal M2, and in addition, selectively a metal M3 are combined, and of a non-metallic element selected from one or two or more of nitrogen, carbon, and oxygen, or an embodiment (Embodiment (2)) including an alloy in which a metal M1 and a metal M2, and in addition, selectively a metal M3 are combined. Although alloying results in higher hardness than that of each monometal even in the case of Embodiment (2), reaction with a non-metallic element as in the case of Embodiment (1) is more preferred because of resulting in more improvement in film hardness, and thus in improvement in scratch resistance and abrasion resistance. However, in the case of Embodiment (1), brightness may be decreased by the amount of the reaction.

The metal M1 is selected from one or two of Mo and W, the metal M2 is selected from one or two or more of Nb, Ta, and V, and the metal M3 is selected from one or two or more of Cr, Ti, Hf, and Zr.

Embodiment (1))

In Embodiment (1), the rigid coating layer 12 contains the reaction compound of the raw metal and the non-metallic element, i.e., a carbide, nitride, oxide, carbonitride, oxynitride, oxycarbide, or oxynitrocarbide of an alloy derived from the raw metal.

In the present invention, the metal M1 and the metal M2 are considered to be contained as a compound of the alloy of the metals since the solid solution of the metal M1 and the metal M2 at the whole rates is made. When the metal M3 is used in combination, the metals M1 to M3 are also considered to be contained as a compound of the alloy of the metals since the solid solution of the metals M1 and M2 and the metal M3 is made. The containing as the compound of the alloy can also be confirmed specifically from X-ray diffraction measurement results. Since the diffraction peak of the compound shifts according to the alloy proportions of the metal M1 and the metal M2, the formed compound of the metal M1 and the metal M2 can be confirmed to be the alloy depending on each proportion.

A film having high adhesion to a substrate and high brightness but having poor corrosion resistance is made when the metal M1 is singly used, while a film having high film hardness and high corrosion resistance but having poor adhesion is made when the metal M2 is singly used. In contrast, in the rigid decorative member of the present invention, since the alloy compound film of the raw metal of the metal M1 and the metal M2 and of the non-metallic element is formed on or above a substrate, a film that has high hardness and is excellent in color tones of brightness and color saturation can be thickly formed on or above a base, and the compatibility of high scratch resistance performance and high corrosion resistance with excellent color tones can be achieved. In addition, further high corrosion resistance can be realized by combining the metal M1 and the metal M2 with the metal M3 and by forming the alloy compound film of the raw metal of the metal M1, the metal M2, and the metal M3 and of the non-metallic element on or above a substrate.

As the metal M1, Mo is more preferably used from the viewpoint of a cost, a color tone, and adhesion. As the metal M2, Nb and Ta are more preferred from the viewpoint of film hardness and corrosion resistance, and Ta is more preferably used from the viewpoint of corrosion resistance. As the metal M3, Cr is more preferred in consideration of corrosion resistance and brightness, and Ti, Hf, and Zr are more preferably used in consideration of allergy performance, when the metal M3 is combined.

In the present invention, a combination of metals may be freely selected depending on desired performances, and specifically, combinations of Mo—Nb and Mo—Nb—Cr are preferably used in view of the balance of the performances of the rigid coating layer.

Furthermore, the raw metal may be combined with a metal M4 selected from one or two or more of B, Al, Si, Mn, Co, La, Ce, Y, and Sc.

In the raw metal (the total of the metal M1, the metal M2, and the optionally used metal M3), 70 mass % or more in total of the metal M1 and the metal M2 is preferably contained. When the amount of the metal M1 and the above metal M2 is in the above range, the balance of the performances of the rigid coating layer is superior.

Specifically, when the metal M1 and the metal M2 are used as the raw metal, the amounts of the metal M1 and the metal M2 are preferably 20 to 80 mass % and 80 to 20 mass %, respectively, in 100 mass % in total. When plural metals M1 are used, the amount of the metals M1 is the total amount of the plural metals. The same applies to the amount of metals M2. Further, in this case, when the metal M1 is only Mo, the amounts of Mo and the metal M2 are more preferably 30 to 70 mass % and 70 to 30 mass %, respectively, in 100 mass % in total in view of the balance of the performances of the rigid coating layer. Further, when the metal M1 is only W, the amounts of W and the metal M2 are more preferably 30 to 70 mass % and 70 to 30 mass %, respectively, and the amounts of W and the metal M2 are further preferably 40 to 60 mass % and 60 to 40 mass %, respectively, in 100 mass % in total, in view of the balance of the performances of the rigid coating layer.

When the metal M1, the metal M2, and the metal M3 are used as the raw metal, it is preferable that the total of the metal M1 and the metal M2 is 70 mass % or more and less than 100 mass %, and the amount of the metal M3 is more than 0 mass % and 30 mass % or less, in 100 mass % in total. When plural metals M1 are used, the amount of the metals M1 is the total amount of the plural metals. The same applies to the amounts of the metals M2 and M3.

Specifically, it is preferable that the amount of the metal M1 is 20 to 79.5 mass %, the amount of the metal M2 is 20 to 79.5 mass %, and the amount of the metal M3 is 0.5 to 30 mass %, in 100 mass % in total, in view of the balance of the performances of the rigid coating layer. Further, it is more preferable that in this case, when the metal M3 is only Cr, the metal M1 is 20 to 79.5 mass %, the metal M2 is 20 to 79.5 mass %, and the metal M3 is 0.5 to 20 mass %, in 100 mass % in total, from the viewpoint of film hardness, corrosion resistance, and an etching property. Further, it is more preferable that the metal M1 is 20 to 79.5 mass %, the metal M2 is 20 to 79.5 mass %, and the metal M3 is 0.5 to 20 mass %, and it is further preferable that the metal M1 is 20 to 79.5 mass %, the metal M2 is 20 to 79.5 mass %, and the metal M3 is 0.5 to 10 mass %, in 100 mass % in total, from the viewpoint of a color tone, when the metal M3 is selected from one or two or more of Ti, Hf, and Zr.

When the metal M4 is combined, it is preferable to use the metal M4 in an amount of more than 0 mass % and 5 mass % or less with respect to the total of the metal M1, the metal M2, and the optionally used metal M3 of 100 mass %. When plural metals M4 are used, the amount of the metals M4 is the total amount of the plural metals.

As the above non-metallic elements, carbon and nitrogen are more preferably used from the viewpoint of film hardness and a color tone. In other words, the reaction compound is more preferably a carbide, a nitride, or a carbonitride. Further, when metals M3 are combined together with the metal M1 and the metal M2 and Ti, Hf, and Zr are used as the metals M3, carbon is more preferably used from the viewpoint of a color tone.

It is desirable that the amount of the above non-metallic elements in the reaction compound is more than 0 atm % and 70 atm % or less in total. In addition, the balance is a metal element. More specifically, it is preferable that in the case of a carbide, the amount of carbon is more than 0 atm % and 60 atm % or less and the amount of the metal element is 40 atm % or more and less than 100 atm %, it is preferable that in the case of a nitride, the amount of nitrogen is more than 0 atm % and 60 atm % or less and the amount of the metal element is 40 atm % or more and less than 100 atm %, and it is preferable that in the case of a carbonitride, the amount of the carbon is 5 to 55 atm %, the amount of nitrogen is 55 to 5 atm %, and the amount of the metal element is 40 to 90 atm %. There is a fear that the excessively large amount of non-metallic elements contained in the reaction compound results in deterioration of hardness and in deterioration of color tones of brightness and color saturation. In the case of the carbonitride, there is an advantage for scratch resistance since hardness becomes higher than that in a case in which each of carbon and nitrogen singly forms the reaction compound; however, there is a fear that the excessively large amount of non-metallic elements contained in the reaction compound still results in deterioration of hardness and in deterioration of color tones of brightness and color saturation.

As described above, in the present invention, corrosion resistance, brightness, etching performance, and allergy performance can be freely controlled by a combination of metals, an alloy proportion, and a combination and the rates of non-metallic elements, and a decorative part having high scratch resistance performance that is not able to be obtained in the conventional art, as well as abrasion resistance performance, a high grade, and high corrosion resistance for ornaments and decorative trims can be obtained.

Embodiment (2))

In Embodiment (2), a rigid coating layer 12 contains an alloy in which a metal M1 and a metal M2, and in addition, selectively a metal M3 are combined.

In the present invention, the metal M1 and the metal M2, and the optionally used metal M3 are considered to be contained as the alloy of the metals since the solid solution of the metal M1 and the metal M2 at the whole rates is made, and the solid solution of the metals M1 and M2 and the metal M3 is also made. The containing as the alloy can also be confirmed specifically from X-ray diffraction measurement results. Since the diffraction peak of the compound shifts according to the alloy proportions of the metal M1 and the metal M2, the formed compound of the metal M1 and the metal M2 can be confirmed to be the alloy depending on each proportion.

A film having high adhesion to a substrate and high brightness but having poor corrosion resistance is made when the metal M1 is singly used, while a film having high film hardness and high corrosion resistance but having poor adhesion is made when the metal M2 is singly used. In contrast, in the rigid decorative member of the present invention, since the alloy film of the metal M1 and the metal M2 is formed on or above a substrate, a layer that has high hardness and is excellent in color tones of brightness and color saturation can be thickly formed on or above a base, and the compatibility of high scratch resistance performance and high corrosion resistance with excellent color tones can be achieved. In addition, further high corrosion resistance can be realized by combining the metal M1 and the metal M2 with the metal M3 and by forming the alloy film of the metal M1, the metal M2, and the metal M3 on or above a substrate.

The more preferred ranges, combination, and preferred amounts of the metals M1 to M3, and the reasons thereof are the same as those of the raw metal of Embodiment (1).

In addition, a metal M4 selected from one or two or more of B, Al, Si, Mn, Co, La, Ce, Y, and Sc may be combined for an alloy.

The preferred amounts in the alloy of the metals M1 to M4 and the reasons thereof are the same as those of the raw metal of Embodiment (1).

As described above, in the present invention, corrosion resistance, brightness, etching performance, and allergy performance can be freely controlled by a combination of metals and an alloy proportion, and a decorative part having high scratch resistance performance that is not able to be obtained in the conventional art, as well as abrasion resistance performance, a high grade, and high corrosion resistance for ornaments and decorative trims can be obtained.

In both Embodiments (1) and (2), the rigid coating layer 12 desirably has a thickness of 0.2 to 4 µm, more desirably 0.5 to 4 µm, and desirably has a film hardness of HV2000 or more. Since the scratch resistance performance depends generally on the film thickness and film hardness of the abrasion-resistant layer, the film thickness and the film hardness are desirably allowed to be as high as possible in order to improve the scratch resistance and the abrasion resistance. Further, the present invention is also advantageous in view of a cost since the compatibility of high scratch resistance performance and high corrosion resistance with an excellent color tone can be achieved even when the thickness of the rigid coating layer 12 is 1 µm or less.

<Method for Producing Rigid Decorative Member>

The method for producing a rigid decorative member of the present invention is a method for producing the rigid decorative member mentioned above. In other words, the method for producing a rigid decorative member comprises a lamination step of laminating a rigid coating layer on or above a base, wherein the rigid coating layer comprises a reaction compound of raw metal in which a metal M1 and a metal M2, and in addition, selectively a metal M3 are combined, and of a non-metallic element selected from one or two or more of nitrogen, carbon, and oxygen (Embodiment (1)), or comprises an alloy in which a metal M1 and a metal M2, and in addition, selectively a metal M3 are combined (Embodiment (2)); the metal M1 is selected from one or two of Mo and W; the metal M2 is selected from one or two or more of Nb, Ta, and V; and the metal M3 is selected from one or two or more of Cr, Ti Hf, and Zr. In Embodiments (1) and (2), a metal M4 selected from one or two or more of B, Al, Si, Mn, Co, La, Ce, Y, and Sc may also be further combined.

When the rigid coating layer is Embodiment (1), the rigid coating layer is formed by a sputtering method or an ion plating method in the lamination step. The rigid coating layer is preferably formed by a reactive sputtering method.

The sputtering method is a method in which a high voltage with a direct current or an alternating current is applied between targets comprising atoms included in the base and the coating while introducing an inert gas (mainly an Ar gas) into a chamber evacuated to a vacuum, and ionized Ar is allowed to collide with the targets to form a thrown-up target substance on the base. In the reactive sputtering method, a slight amount of reactive gas is introduced with the inert gas, whereby a reaction compound coating of the atoms included in the targets and the reactive gas can be formed on the base. The kinds and rates of the atoms included in the targets are considered to be also maintained in the reactive compound.

The target (raw metal) is preferably an alloy in which the metal M1 and the metal M2, and in addition, selectively the metal M3 are combined, and more specifically a sintered body of the alloy of the metals. In addition, the target may be a sintered body of an alloy in which the metal M4 is combined. In the sintered body, the kinds and rates of the metal M1 and the metal M2, and the metal M3 and the metal M4 which are optionally used are the same as those explained in the rigid coating layer mentioned above.

Reactive gases include carbon atom-containing gases (gases containing no oxygen atom) such as methane gas and acetylene gas, nitrogen atom-containing gases such as nitrogen gas and ammonia, and oxygen atom-containing gases such as oxygen gas and carbon dioxide. Inert gases include Ar gas, Kr gas, and Xe gas.

In a case in which a carbide, a nitride or a carbonitride is obtained as the reaction compound, a carbide film can be formed when 1 to 200 sccm of only a carbon atom-containing gas is introduced, a nitride film can be formed when 1 to 200 sccm of only a nitrogen atom-containing gas is introduced, and a carbonitride film can be formed when a mixture of a carbon atom-containing gas and a nitrogen atom-containing gas is introduced in a range in which the total amount of introduced reactant gas is not more than 200 sccm, for example, under the condition of 100 to 200 sccm of an inert gas although the conditions thereof are not identical depending on a production apparatus. When the amount of the gas is in the above range, the amount of the non-metallic element in the reaction compound can be adjusted in the range explained in the rigid coating layer mentioned above. It is preferable to introduce 100 to 200 sccm of the inert gas with the reactant gas although the conditions thereof are not identical depending on a production apparatus. The amount of the gas can be adjusted by an automatically controlled mass flow controller.

The reactive sputtering method has high controllability of film quality and a film thickness, and is easily automated. Further, since sputtered atoms have high energy, the heating of the base for improving adhesion is not needed, and a film can be formed even on a base such as plastic having a low melting point. Further, because of the method in which the thrown-up target substance is formed on the base, film formation even with a high-melting-point material is possible, and a material is freely selected.

Furthermore, a carbide film, a nitride film, a carbonitride film, an oxynitride film, an oxycarbide film, an oxynitrocarbide film, or the like can be easily formed by selecting or mixing reactive gases as mentioned above. Alloying of the atoms included in the targets also enables the formation of an alloy coating, and the formation of the carbide film, nitride film, carbonitride film, oxynitride film, oxycarbide film, oxynitrocarbide film, or the like of an alloy. Further, the adhesion, film hardness, and color tone of the rigid decorative member can be controlled by adjusting the kinds and rates of the atoms included in the targets, and the selection and amount of the reactive gas.

When the rigid coating layer is Embodiment (2), the rigid hard coating layer is also formed by a sputtering method or an ion plating method in the lamination step. The kinds and rates of the atoms included in the targets are considered to be also maintained in the formed rigid coating layer.

The target (raw metal) is preferably an alloy in which the metal M1 and the metal M2, and in addition, selectively the metal M3 are combined, and more specifically a sintered body of the alloy of the metals. In addition, the target may be a sintered body of an alloy in which the metal M4 is combined. In the sintered body of the alloy of the metals, the kinds and rates of the metal M1 and the metal M2, and the metal M3 and the metal M4 which are optionally used are the same as those explained in the rigid coating layer mentioned above.

Inert gases include Ar gas, Kr gas, and Xe gas. It is preferable to introduce 100 to 200 sccm of the inert gas although the conditions thereof are not identical depending on a production apparatus. The amount of the gas can be adjusted by an automatically controlled mass flow controller.

The adhesion, film hardness, and color tone of the rigid decorative member can be controlled by adjusting the kinds and rates of the atoms included in the targets.

The rigid decorative member having such properties as mentioned above can be obtained by the above production method.

The rigid decorative member illustrated in FIG. 1 includes a base and a rigid coating layer laminated directly on the base, and other embodiments of the present invention include a rigid decorative member in which an undercoat layer is further laminated between a base and a rigid coating layer, and a rigid decorative member in which a finishing layer is further laminated on or above a rigid coating layer. Examples thereof also include a rigid decorative member in which at least one coating having a color tone different from that of a rigid coating layer is further formed on a portion of a surface of the rigid coating layer, and a rigid decorative member in which a transparent protective film is further laminated on or above a rigid coating layer.

(Undercoat Layer)

The undercoat layer comprises at least one plating coating formed on the base, for example, by a wet plating method and/or a dry plating method. Adhesion can be improved by forming the undercoat layer.

When the base comprises a metal other than copper and copper alloy, or ceramic, a metal coating formed by a dry plating method and comprising titanium (Ti), chromium (Cr), molybdenum (Mo), tungsten (W), zirconium (Zr), hafnium (Hf), vanadium (V), niobium (Nb), tantalum (Ta), magnesium (Mg), aluminum (Al), germanium (Ge), or silicon (Si), or a suboxide containing a slight amount of oxygen is desirable as the undercoat layer formed on the surface of the base, and these are chosen according to the compatibility thereof with the base.

The undercoat layer is also preferably a metal compound coating that is formed by a dry plating method, has a carbon atom content of 5 to 15 atom %, and comprises titanium carbide (TiC), chromium carbide ($Cr_3C_2$), zirconium carbide (ZrC), hafnium carbide (HfC), vanadium carbide (VC), niobium carbide (NbC), tungsten carbide (WC), molybdenum carbide (MoC), or tantalum carbide (TaC), or chromium nitride (CrN), vanadium nitride (VN), niobium nitride (NbN), tungsten nitride (WN), molybdenum nitride (MoN), or tantalum nitride (TaN) that is formed by a dry plating method and has a nitrogen atom content of 5 to 15 atom %. It is preferable that the carbon atom content or nitrogen atom content of the metal compound is gradually decreased with being closer to the surface of the base in the metal compound coating, and the metal compound coating is referred to as a so-called gradient film.

The thicknesses of the metal coating and the metal compound coating (undercoat layer) is desirably 0.02 to 0.2 μm and particularly preferably 0.05 to 0.1 μm.

Specific examples of dry plating methods include a sputtering method, an arc method, an ion plating method, a physical vapor deposition method (PVD) with an ion beam or the like, CVD, and the like. Especially, a sputtering method, an arc method, and an ion plating method are particularly preferably used.

Further, in the rigid decorative member of the present invention, when the base comprises copper or a copper alloy, the undercoat layer preferably comprises a nickel coating that is formed on the surface of the base by a wet plating method and has a thickness of 1 to 10 μm, preferably 1 to 5 μm, and an amorphous nickel-phosphorus alloy coating that is formed on the surface of the nickel coating by a wet plating method and has a thickness of 3 to 10 µm, preferably 3 to 5 µm.

Further, when the base comprises copper or a copper alloy, the undercoat layer is preferably a coating that is formed by a wet plating method, comprises at least one of copper, palladium, copper-tin alloy, copper-tin-zinc alloy, and copper-tin-palladium alloy, and has a thickness of 2 to 9 µm, preferably 2 to 3 µm, in view of prevention of nickel allergy.

The metal compound coatings may also be alloys that are formed by a dry plating method or a wet plating method, are other than the above, and do not contain nickel.

(Finishing Layer)

The finishing layer comprises a coating of a noble metal (including an alloy) that is formed on a surface of the rigid coating layer by a dry plating method. A desired appearance is obtained by disposing the finishing layer. Even when the finishing layer is disposed, high scratch resistance performance, an excellent color tone, and high corrosion resistance are obtained since the rigid coating layer exists thereunderneath.

As such a coating comprising a noble metal, a noble metal coating comprising platinum (Pt), palladium (Pd), rhodium (Rh), a platinum alloy, a palladium alloy, or a rhodium alloy is desirable.

The thickness of the finishing layer is 0.002 to 0.1 µm, preferably 0.005 to 0.1 µm, further preferably 0.01 to 0.08 µm. However, when a platinum coating or a platinum alloy coating is formed as the finishing layer, the thickness of the coating is 0.002 to 0.01 µm, preferably 0.005 to 0.08 µm.

(Coating with Color Tone Different from that of Rigid Coating Layer)

In the rigid decorative member of the present invention, at least one coating with a color tone different from that of a rigid coating layer may be formed on a portion of a coating surface comprising the rigid coating layer and having a white color or a stainless steel color by a dry plating method or a wet plating method. Even when the coating with a color tone different from that of the rigid coating layer is disposed, high scratch resistance performance, an excellent color tone, and high corrosion resistance are obtained since the rigid coating layer exists thereunderneath.

As the coating with a color tone different from that of the rigid coating layer, a coating comprising gold, a gold alloy (preferably a gold alloy containing no nickel), titanium nitride, zirconium nitride, hafnium nitride, or diamond-like carbon (DLC) is desirable. The coating, together with an outermost layer forming the rigid coating layer, appears on the appearance of a decorative trim. Accordingly, the rigid decorative member of the present invention involves a so-called two-tone rigid decorative member.

The thickness of the plating coating with a color tone different from that of the rigid coating layer is typically 0.1 to 1.0 µm, preferably 0.2 to 0.5 µm.

The coating with a color tone different from that of the rigid hard coating layer may also have a two-layer structure of a lower layer comprising titanium nitride, zirconium nitride, or hafnium nitride, and an upper layer comprising gold or a gold alloy (preferably a gold alloy containing no nickel) (e.g., gold-iron alloy). In this case, the thickness of the lower layer is typically 0.2 to 1.5 µm, preferably 0.5 to 1.0 µm, and the thickness of the upper layer is typically 0.03 to 0.2 µm, preferably 0.05 to 0.1 µm.

Furthermore, the coating with a color tone different from that of the rigid coating layer may have a three-layer structure of a lower layer comprising titanium, an intermediate layer comprising titanium nitride, zirconium nitride, or hafnium nitride, and an upper layer comprising gold or a gold alloy (preferably a gold alloy containing no nickel). In this case, the thickness of the lower layer is typically 0.02 to 0.2 µm, preferably 0.03 to 0.1 µm, the thickness of the intermediate layer is typically 0.2 to 1.5 µm, preferably 0.5 to 1.0 µm, and the thickness of the upper layer is typically 0.03 to 0.2 µm, preferably 0.05 to 0.1 µm.

Furthermore, a titanium coating, a silicon coating, and a diamond-like carbon (DLC) coating may also be formed in this order on a portion of a surface of the rigid coating layer in the coating with a color tone different from that of the rigid coating layer. In this case, the thickness of the lower layer is typically 0.05 to 0.3 µm, preferably 0.08 to 0.2 µm, the thickness of the intermediate layer is typically 0.05 to 0.3 µm, preferably 0.08 to 0.2 µm, and the thickness of the upper layer is typically 0.5 to 3.0 µm, preferably 0.8 to 1.5 µm.

Each layer included in the single-layer structure, the two-layer structure, and the three-layer structure described above is typically formed by a dry plating method. Specific examples of the dry plating method include a sputtering method, an arc method, an ion plating method, a physical vapor deposition method (PVD) with an ion beam or the like, CVD, and the like. Especially, a sputtering method, an arc method, and an ion plating method are particularly preferably used.

The coating with a color tone different from that of the rigid coating layer may also have a two-layer structure of a lower layer comprising a gold strike plating coating formed by a wet plating method, or the like, and an upper layer comprising a gold or gold alloy plating coating (preferably a gold alloy plating coating containing no nickel) formed by a wet plating method, or the like. In this case, the thickness of the lower layer is typically 0.05 to 0.2 µm, preferably 0.05 to 0.1 µm, and the thickness of the upper layer is typically 1.0 to 10 µm, preferably 1.0 to 3.0 µm.

A rigid decorative member having such a coating with a color tone different from that of a rigid coating layer on a portion of a surface of the rigid coating layer can be prepared, for example, by such a method as described below.

A rigid decorative member comprising a white- or stainless steel-colored coating and at least one plating coating with a color tone different from the coating and having two or more color tones can be obtained by performing at least one step of, first, subjecting a portion of a surface of a rigid decorative member to masking treatment, forming a plating coating with a color tone different from that of the rigid decorative member on the surface of the rigid decorative member and the mask by a dry plating method or a wet plating method, and then removing the mask and the plating coating on the mask.

(Protective Film)

A transparent protective film can also be formed on or above the rigid coating layer. Even when the transparent protective film is disposed, high scratch resistance performance, an excellent color tone, and high corrosion resistance are obtained since the rigid coating layer exists thereunderneath.

Coating with a diamond-like carbon film as the protective film can result in a coating that has high hardness and excellent abrasion resistance and is more inhibited from being scratched even when being carried for a long term. The diamond-like carbon film is an amorphous rigid carbon film containing hydrogen and is known as a film that has characteristics similar to those of diamond, such as high hardness, a low friction coefficient, a refractive index, and an electrical insulation property, and is excellent in smoothness.

It was further found that, for coating with the diamond-like carbon film, transparency can be maintained by incorporating one or more elements selected from B, N, F, Si, Ge, P, and As even in the case of coating with the diamond-like carbon film having a film thickness in a range of 0.1 μm or less. In other words, in the case of coating with the diamond-like carbon film, diamond-like carbon presents a brown color to a black color with increasing the thickness of the film because of absorbing light in a visible light region; however, it was found that the thickness of the film can be increased without deteriorating transparency by incorporating such an element as described above. It will be appreciated that in addition to the above diamond-like carbon film, a known transparent protective film such as aluminum oxynitride may be formed.

<Watch>

The watch of the present invention is a watch comprising exterior parts, wherein some or all of the exterior parts include the rigid decorative member mentioned above. In other words, the watch provided by the present invention is characterized in that some of parts included in the watch, for example, exterior parts have the white rigid decorative member mentioned above.

The watch may be any of photovoltaic watches, thermo electric generating watches, radio wave reception type self-correction watches, mechanical watches, and general electronic watches. Such a watch is produced by a known method using the rigid decorative member. The watch is an example of decorative members that are easily scratched by friction with a shirt or by collision with a desk, a wall, or the like. The rigid decorative member of the present invention is formed into the watch, whereby a state in which a scratch is inhibited and an appearance is very beautiful can be maintained for many years.

Based on the above, the present invention relates, for example, to the following (1) to (10):

(1) A rigid decorative member comprising a base and a rigid coating layer laminated on or above the base, wherein the rigid coating layer comprises a reaction compound of raw metal, in which a metal M1 and a metal M2, and in addition, selectively a metal M3 are combined, and of a non-metallic element selected from one or two or more of nitrogen, carbon, and oxygen, or comprises an alloy in which a metal M1 and a metal M2, and in addition, selectively a metal M3 are combined; the metal M1 is selected from one or two of Mo and W; the metal M2 is selected from one or two or more of Nb, Ta, and V; and the metal M3 is selected from one or two or more of Cr, Ti, Hf, and Zr.

In such a rigid decorative member, deterioration of appearance quality due to a scratch, abrasion, or the like is suppressed, and the rigid decorative member has a white rigid coating layer having a high-grade color tone. Furthermore, film hardness, scratch resistance performance, abrasion resistance performance, color tones such as brightness and color saturation, corrosion resistance performance, etching performance, and allergy performance are desirably controlled.

(2) The rigid decorative member according to (1), wherein the metal M2 is selected from one or two of Nb and Ta.

Thereby, further high film hardness and corrosion resistance can be realized.

(3) The rigid decorative member according to (1) or (2), wherein the raw metal is combined with the metal M3; and the metal M3 is Cr.

Thereby, further high corrosion resistance can be realized.

(4) The rigid decorative member according to any one of (1) to (3), wherein 70 mass % or more in total of the metal M1 and the metal M2 is contained in the raw metal.

When the amount of the metal M1 and the metal M2 is in the above range, the balance of the performances of the rigid coating layer is superior.

(5) The rigid decorative member according to any one of (1) to (4), wherein the rigid coating layer has a thickness of 0.5 to 4 μm.

When the thickness of the rigid coating layer is in the above range, higher scratch resistance and abrasion resistance are obtained.

(6) The rigid decorative member according to any one of (1) to (5), wherein the appearance color of the rigid coating layer is a white color or a stainless steel color.

In the present invention, a high-grade color tone is obtained since the rigid coating layer contains a reaction product of an alloy in which the specified metals described above are combined, or the alloy.

(7) The rigid decorative member according to any one of (1) to (6), wherein an undercoat layer is further laminated between the base and the rigid coating layer, or a finishing layer is further laminated on or above the rigid coating layer.

Adhesion can be improved by forming the undercoat layer. Further, a desired appearance is obtained by disposing the finishing layer. Even when the finishing layer is disposed, high scratch resistance performance, an excellent color tone, and high corrosion resistance are obtained since the rigid coating layer exists thereunderneath.

(8) A watch comprising an exterior part, wherein a portion or the entirety of the exterior part comprises the rigid decorative member according to any one of (1) to (7).

The rigid decorative member is formed into the watch, whereby a state in which a scratch is inhibited and an appearance is very beautiful can be maintained for many years.

(9) A method for producing a rigid decorative member, comprising laminating a rigid coating layer on or above a base, wherein the rigid coating layer comprises a reaction compound of raw metal, in which a metal M1 and a metal M2, and in addition, selectively a metal M3 are combined, and of a non-metallic element selected from one or two or more of nitrogen, carbon, and oxygen, or comprises an alloy in which a metal M1 and a metal M2, and in addition, selectively a metal M3 are combined; the metal M1 is selected from one or two of Mo and W; the metal M2 is selected from one or two or more of Nb, Ta, and V; and the metal M3 is selected from one or two or more of Cr, Ti, Hf, and Zr.

According to such a production method, a rigid decorative member, in which deterioration of appearance quality due to a scratch, abrasion, or the like is suppressed, and which has a white rigid coating layer having a high-grade color tone, is obtained. Furthermore, film hardness, scratch resistance performance, abrasion resistance performance, color tones such as brightness and color saturation, corrosion resistance performance, etching performance, and allergy performance are desirably controlled.

(10) The method for producing a rigid decorative member according to (9), wherein the raw metal is an alloy in which a metal M1 and a metal M2, and in addition, selectively a metal M3 are combined; and the rigid coating layer is laminated on or above the base by a reactive sputtering method.

According to such a production method, a rigid decorative member, in which deterioration of appearance quality due to a scratch, abrasion, or the like is further suppressed, and which has a white rigid coating layer having a higher-grade color tone, is obtained. Furthermore, film hardness, scratch resistance performance, abrasion resistance performance, color tones such as brightness and color saturation, corrosion resistance performance, etching performance, and allergy performance are more desirably controlled.

The present invention will be further specifically explained below based on examples, but the present invention is not limited to the examples.

EXAMPLES

<Evaluation Method>
(Method for Measuring Film Hardness)

Film hardness was measured using a micro indentation hardness tester (H100 manufactured by FISCHER). A Vickers indenter was used for a gauge head, retained for 10 seconds at a load of 5 mN, and thereafter unloaded, and the film hardness was calculated from the depth of the inserted Vickers indenter.

(Method for Testing Corrosion Resistance)

In a CASS test according to JIS-H8502, putting was performed for 48 hours in an atmosphere, in which a solution obtained by adding cupric chloride to a sodium chloride solution with acetic acid acidity was sprayed, and the peeling and discoloration of a decorative film were observed to evaluate corrosion resistance. Evaluation criteria are as follows.

Good: ΔE is 0.8 or less in judgment of a color difference, and neither peeling nor pitting corrosion occurs.

Fair: ΔE is more than 0.8 and 1.6 or less in judgment of a color difference, and neither peeling nor pitting corrosion occurs.

Poor: ΔE is more than 1.6 in judgment of a color difference, or peeling and pitting corrosion occur.

In an artificial sweat test according to ISO 12870, putting was performed in an atmosphere in which a liquid in which sodium chloride and lactic acid were mixed (artificial sweat) was aerated at 55° C. for 48 hours, and the degree of the discoloration of a decorative film was observed to evaluate corrosion resistance. Evaluation criteria are as follows.

Good: ΔE is 0.8 or less in judgment of a color difference.

Fair: ΔE is more than 0.8 and 1.6 or less in judgment of a color difference.

Poor: ΔE is more than 1.6 in judgment of a color difference.

For alkali resistance, dipping was performed in a 5% aqueous sodium hydroxide solution under the conditions of 24 hours and 30° C., and the peeling and discoloration of a decorative film were observed to evaluate corrosion resistance. Evaluation criteria are as follows.

Good: ΔE is 0.8 or less in judgment of a color difference, and no peeling occurs.

Fair: ΔE is more than 0.8 and 1.6 or less in judgment of a color difference, no peeling occurs.

Poor: ΔE is more than 1.6 in judgment of a color difference, or peeling occurs.

(Method for Testing Hypochlorous Acid Resistance)

For hypochlorous acid resistance, dipping was performed in 1%, 3% and 6% aqueous sodium hypochlorite solutions under the conditions of 3 hours and 30° C., and the peeling and discoloration of decorative films were observed to evaluate corrosion resistance. Evaluation criteria are as follows.

Good: ΔE is 0.8 or less in judgment of a color difference, and no peeling occurs.

Fair: ΔE is more than 0.8 and 1.6 or less in judgment of a color difference, and no peeling occurs.

Poor: ΔE is more than 1.6 in judgment of a color difference, or peeling occurs.

For judgment of a color difference, calculation is carried out from a color difference before and after a test. When the color tone of a film before the test is ($L^*$, $a^*$, $b^*$) and the color tone of the film after the test is ($L1^*$, $a1^*$, $b1^*$), the color difference is calculated from $$[[L^*-L1^*]^2+[a^*-a1^*]^2+(b^*-b1^*)^2]^0.5.$$

The above-mentioned evaluation criteria were determined in reference to a color tolerance table below.

TABLE 1

Color Tolerance Table

| Name | Range of Color Difference ΔE* | Range of Perceived Color Difference |
|---|---|---|
| Unevaluable region | 0-0.2 | In an error range even with a specially adjusted colorimetric instrument. Unidentifiable by a human. |
| Marginal color difference | 0.2-0.4 | Marginal color difference that can be identified with reproducibility in the range of the reproducibility precision of a sufficiently adjusted colorimetric instrument by a human receiving training. |
| Special grade (severe color difference) | 0.4-0.8 | Marginal color difference for which the specification of a severe tolerable color difference can be set in view of the reproducibility of visual judgment. |
| First grade (tolerable color difference) | 0.8-1.6 | Level at which a slight color difference can be perceived in comparison of adjacent colors. Range of a tolerable color difference including an instrumental error between general colorimetric instruments. |
| Second grade (practical color difference) | 1.6-3.2 | Level of a color difference that is hardly perceived in comparison of a difference between colors. Level at which the colors are generally regarded as the same color. |

TABLE 1-continued

Color Tolerance Table

| Name | Range of Color Difference ΔE* | Range of Perceived Color Difference |
|---|---|---|
| Third grade | 3.2-6.5 | Range in which colors can be treated as the same color at an impression level. Complaints may be received for a color drift in the coating industry or the plastic industry. |
| Fourth grade | 6.5-13.0 | Color difference corresponding to one step in the JIS standard color chart, the Mansell color chart, etc. |
| Fifth grade | 13.0-25.0 | Difference of colors in a degree that can be distinguished by fragmented system color names. When the degree is exceeded, the image of another color name is generated. |

(Method for Testing Etching)

A sample was dipped in 60% of hot nitric acid at 80° C. and a solution of 40% of nitric acid, 25% of sulfuric acid, and 4% of fluorinated acid, and time where a decorative film was completely peeled from a base was measured to evaluate an etching property. In tables in which evaluation results are listed, "poor" exhibits impossible etching.

In the etching test, a sample on which a film having a thickness of 1 µm was formed was separately produced for the test.

(Overall Evaluation)

In the tables in which the evaluation results are listed, overall evaluation criteria are as follows.

Good: For all, corrosion resistance is good. A film of 1.5 µm or more can be formed.

Fair: A film of 1.5 µm or more can be formed although corrosion resistance is fair, or it is impossible to form a film of 1.5 µm or more although corrosion resistance is good.

Poor: Corrosion resistance is poor.

(Method for Measuring Color Tone)

The color tone (brightness, color saturation) measurement of the decorative member was conducted using SpectraMagic NX manufactured by KONICA MINOLTA. The L*a*b* of each film was measured with an L*a*b* chromaticity diagram using a light source D65 to measure brightness L* and color saturation $$C^* = \sqrt{a^{*2} + b^{*2}}$$

whereby the color tone was measured.

Example 1

First Example of the present invention will be explained with reference to FIG. 2, FIG. 3, FIG. 4, FIG. 5, Table 1, and Table 2.

Figure 2:
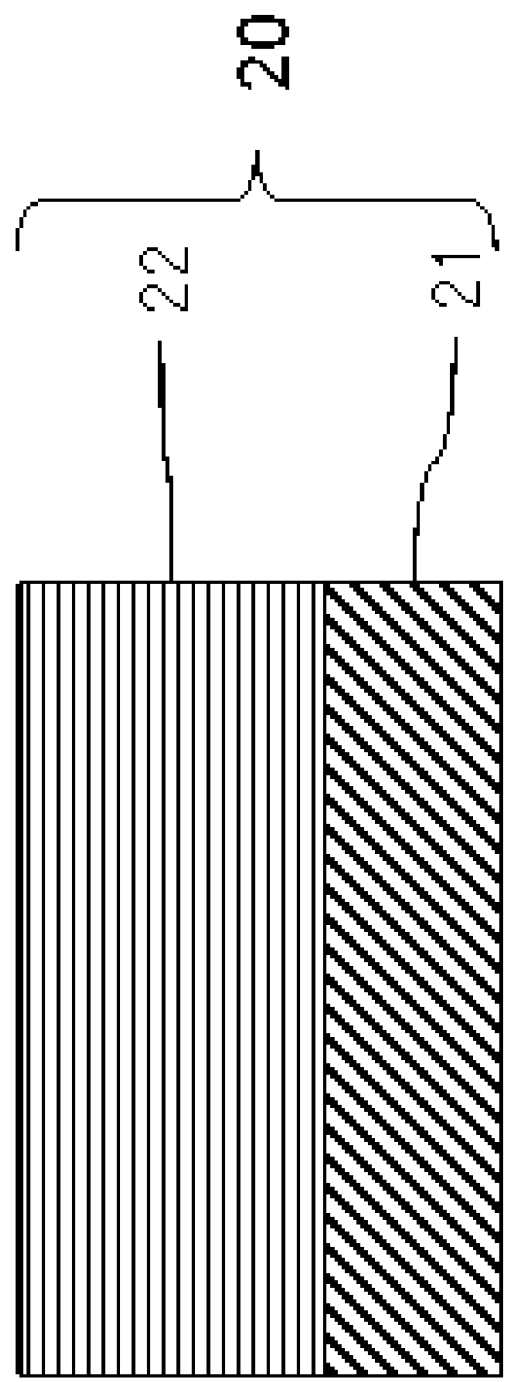
FIG. 2 illustrates a cross-sectional schematic view of a rigid decorative member 20.
Figure 3:
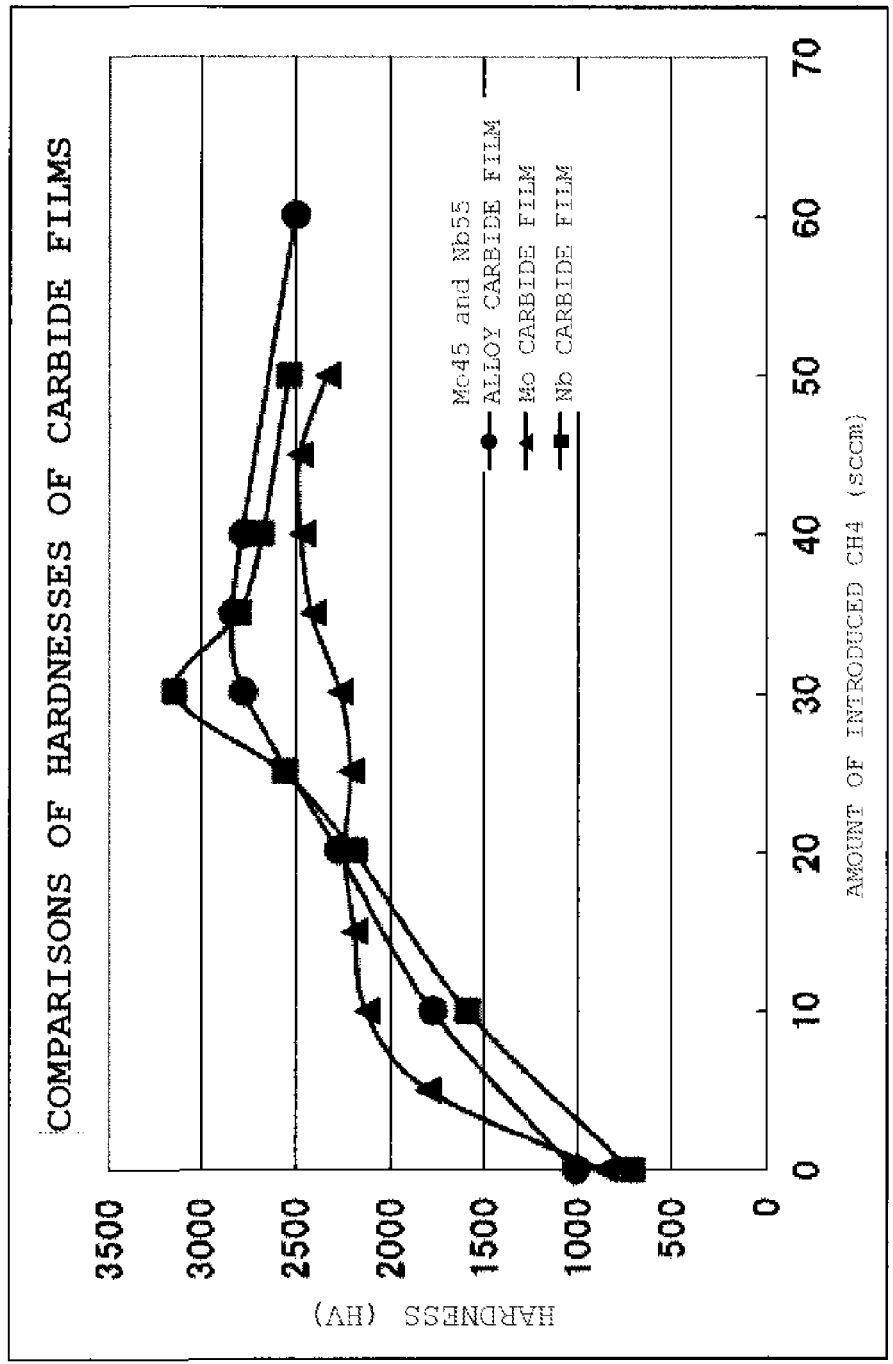
FIG. 3 is a view of a comparison of the film hardnesses of a rigid carbide film 22, a Mo carbide film, and a Nb carbide film, produced by changing the amount of methane gas.
Figure 4:
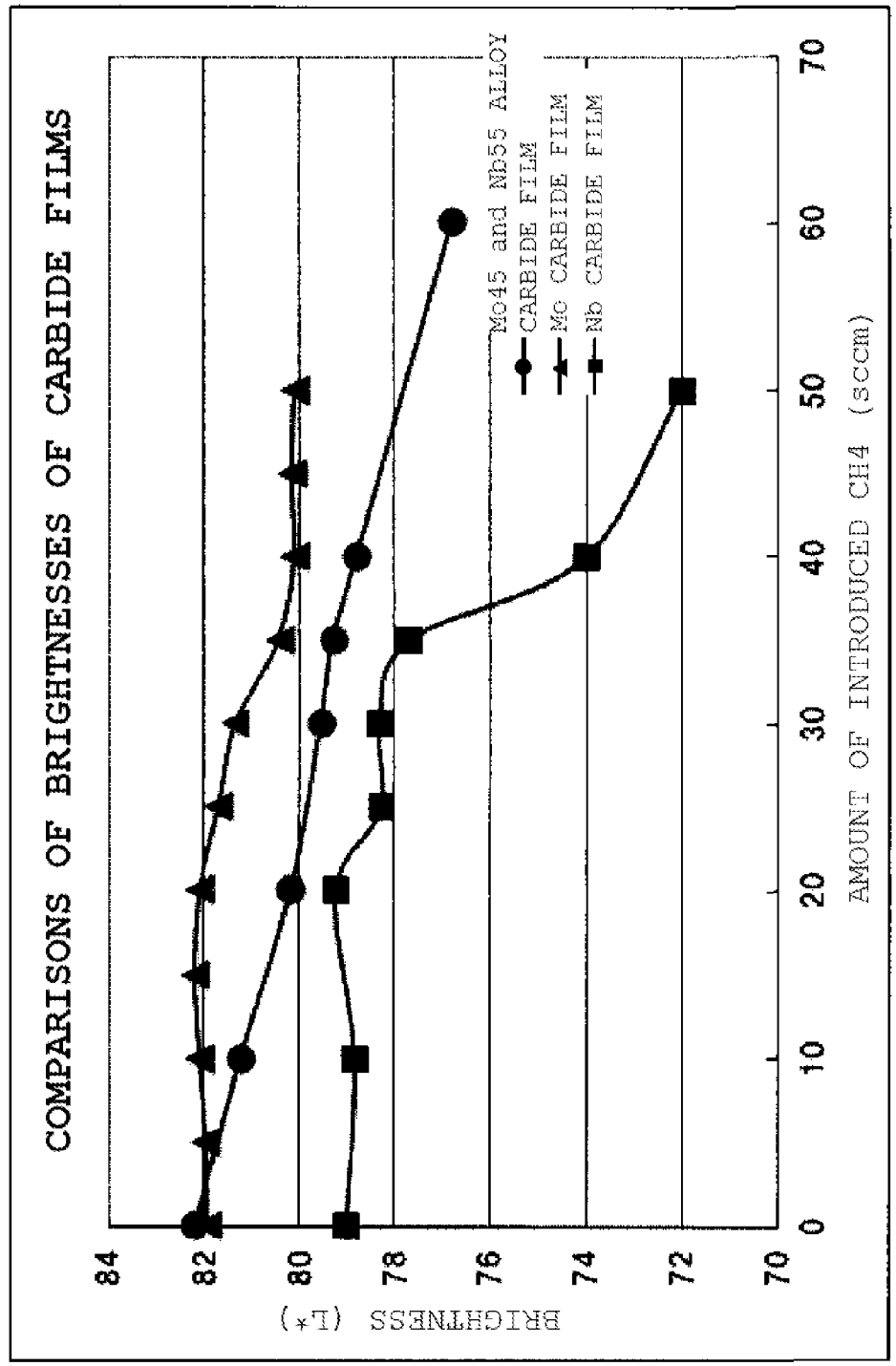
FIG. 4 is a view of a comparison of the brightnesses of the rigid carbide film 22, the Mo carbide film, and the Nb carbide film, produced by changing the amount of methane gas.
Figure 5:
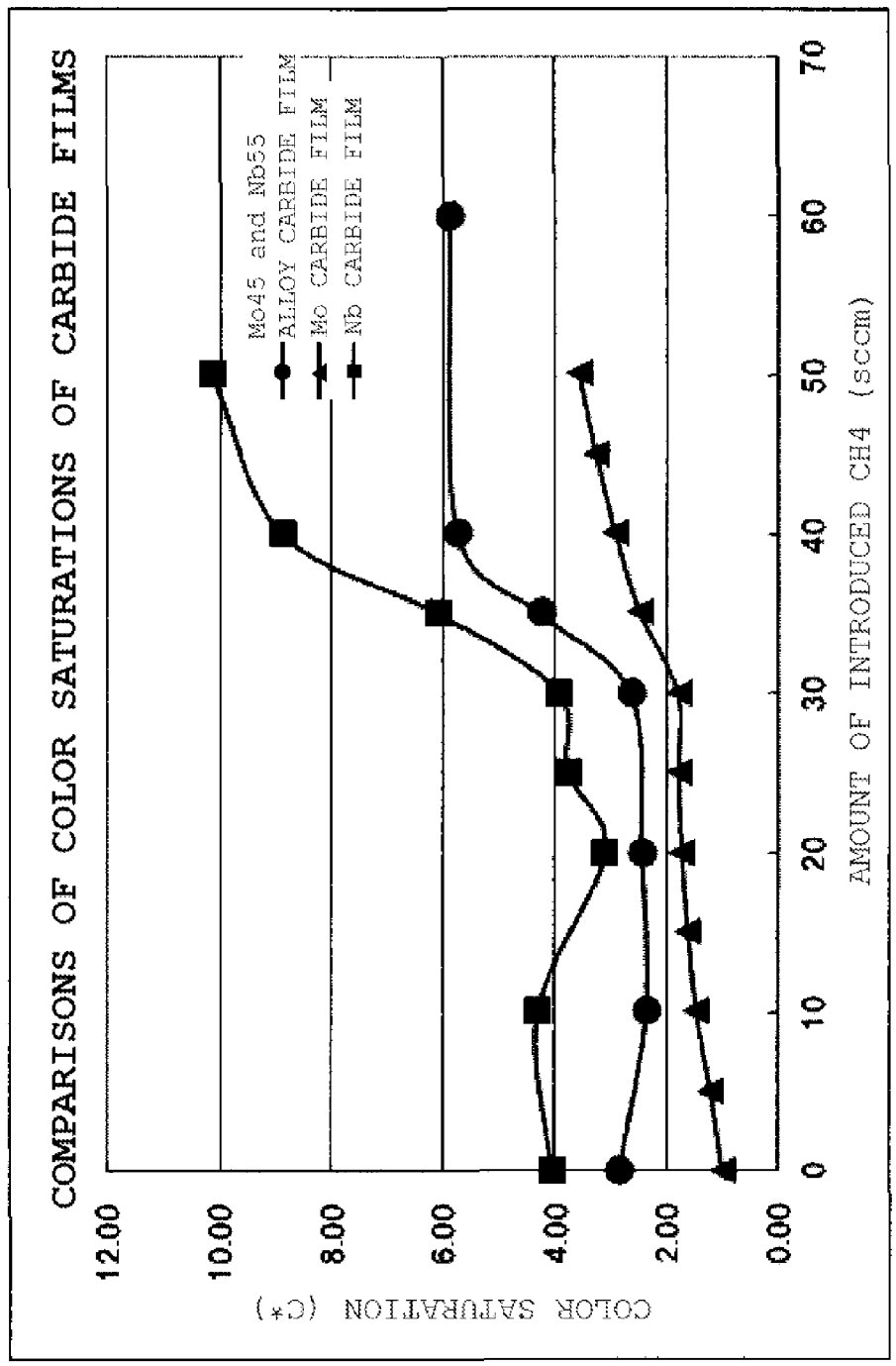
FIG. 5 is a view of a comparison of the color saturations of the rigid carbide film 22, the Mo carbide film, and the Nb carbide film, produced by changing the amount of methane gas.

FIG. 2 is a cross-sectional schematic view of a rigid decorative member 20, FIG. 3 is a view of comparisons of the film hardnesses of a rigid carbide film 22 (rigid coating layer), a Mo carbide film, and a Nb carbide film, which were produced by changing the amount of methane gas, FIG. 4 is a view of comparisons of the brightnesses of the rigid carbide film 22, the Mo carbide film, and the Nb carbide film, which were produced by changing the amount of methane gas, FIG. 5 is a view of comparisons of the color saturations of the rigid carbide film 22, the Mo carbide film, and the Nb carbide film, which were produced by changing the amount of methane gas, Table 1 is a table in which variations in diffraction angle obtained by measurement of the X-ray diffraction of carbide films produced by changing the proportions of Mo and Nb are listed, and Table 2 is a table of comparisons of maximum hardness, corrosion resistance performance, and etching performance in the case of changing the proportions of Mo and Nb.

(1-1) A sintered body of 45 wt % Mo and 55 wt % Nb as the composition of a sputtering target of Example 1 was used. An SUS316L material specified by JIS was used as a base 21, and a MoNb alloy carbide film of 1.6 µm was formed on the base 21 by introducing 30 sccm of methane gas under a constant Ar gas amount of 105 sccm by a sputtering method.

The quantitative analysis of a film sample by EPMA revealed that the MoNb alloy carbide film contained 40.2 mass % of Mo, 51.8 mass % of Nb, and 8 mass % of C. For C, the quantitative result obtained by performing ZAF correction using calculated intensity is indicated.

(1-2) FIG. 3 represents a view of the comparisons of the film hardness of the MoNb alloy carbide film produced by changing the amount of methane gas with those of the Mo carbide film and the Nb carbide film. The hardness of the MoNb alloy carbide film is found to exhibit obviously high hardness compared to that of the Mo carbide film and to also exhibit high hardness that is approximately equivalent to that of the Nb carbide film.

Since the scratch resistance performance is determined generally by the product of the hardness of the abrasion-resistant layer, the film thickness of the abrasion-resistant layer, the degree of adhesion to the base, and the hardness of the base, it is preferable to thickly form the film under the condition of the highest hardness. Therefore, the Nb carbide film is superior to the MoNb alloy carbide film from the viewpoint of film hardness; however, since the Nb carbide film has high film stress and also has poor adhesion to a substrate, the film having a film thickness of only around 1.0 µm can be formed. Conversely, since the Mo carbide film has low film stress and high adhesion to the substrate, peeling or the like does not occur even when the film of 3.0 µm or more is formed; however, since the film has low film hardness, it is impossible to obtain high scratch resistance performance. Since the MoNb alloy carbide film has the characteristics of both Mo and Nb, the film has high hardness and also has high adhesion to the base, therefore, the peeling of the film or the like does not occur even when the film of 2.0 µm or more is formed, and high scratch resistance performance is obtained.

FIG. 4 is a view of comparisons of the brightnesses of the films produced by changing the amount of methane gas in the MoNb alloy carbide film. The brightness of the MoNb alloy carbide film is found to exhibit obviously high brightness compared to the Nb carbide film and to also exhibit high brightness that is approximately equivalent to that of the Mo carbide film.

Examples of performances demanded in exterior parts include brightness, and higher brightness results in higher-grade decoration. A white decorative member having a brightness (L*) of 78 or more is generally desired, and judging from the results of FIG. 4, the Nb carbide film has a brightness L* of less than 78, therefore, the Nb carbide film is almost gray rather than white, and a higher grade is not obtained. In the MoNb alloy carbide film, high brightness can be obtained by alloying Mo.

FIG. 5 is a view of comparisons of the color saturations (C*) of the films produced by changing the amount of methane gas in the MoNb alloy carbide film. The color saturation of the MoNb alloy carbide film substantially indicates the median value of those of the Nb carbide film and the Mo carbide film. Since a color saturation (C*) that is closer to zero (0) is better in the case of a white color, the decorative member on which the MoNb alloy carbide film of Example 1 is formed is found to obviously have a white color compared to the Nb carbide film.

The quantitative analysis of a film sample by EPMA revealed that the MoNb alloy film obtained without introducing a methane gas using a sintered body of 45 wt % Mo and 55 wt % Nb contained 44.8 mass % of Mo and 55.2 mass % Nb.

In addition, the amount of C in the MoNb alloy carbide film produced as described above was determined by the quantitative analysis of a film sample by ESCA (X-ray photoelectron spectroscopy). MoNb alloy carbide films produced by introducing methane gases of which the amounts were 10, 20, 30, 35, 40, and 60 ccm contained 9.9, 21.5, 27.1, 30.3, 32.2, and 45.0 atm % of C, respectively.

(1-3) In Table 1, the results of the X-ray diffraction measurement of MoNb alloy carbide films produced by changing a MoNb alloy proportion are listed. In other words, rigid decorative members were produced in the same manner as in (1-1) except that sintered bodies in which the proportions of Mo and Nb are listed in Table 1 were used as sputtering targets. Since a diffraction peak is confirmed to shift depending on the alloy proportions of Mo and Nb of which the solid solution at the whole rates is made, the formed MoNb alloy carbide films are considered to be alloys depending on the respective proportions.

TABLE 1

| Film Composition | Proportion of Mo (wt %) | Proportion of Nb (wt %) | Carbide Diffraction Peak (hkl) | | | | |
|---|---|---|---|---|---|---|---|
| | | | (111) | (200) | (220) | (311) | (222) |
| MoC film | 100 | 0 | 36.50 | 41.96 | 61.08 | 73.10 | 76.88 |
| MoNbC film | 70 | 30 | 35.60 | 41.15 | 59.79 | 71.63 | 75.17 |
| MoNbC film | 45 | 55 | 34.91 | 40.67 | 58.94 | 70.11 | 73.87 |
| MoNbC film | 30 | 70 | 34.70 | 40.44 | 58.43 | 69.98 | 73.31 |
| NbC film | 0 | 100 | 34.38 | 40.08 | 57.84 | 69.22 | 73.02 |

(1-4) In Table 2, the hardnesses of a carbide film, a nitride film, and a carbonitride film, corrosion resistances, etching properties, and overall evaluations are listed with respect to MoNb alloy proportions. In other words, rigid decorative members having carbide films were produced in the same manner as in (1-1) except that sintered bodies of which the proportions of Mo and Nb are listed in Table 2 were used as sputtering targets. A test for the corrosion resistances and etching properties of the rigid decorative members was conducted.

In addition, rigid decorative members having a carbide film, a nitride film, and a carbonitride film were produced by changing the kind and amount of gas. In the case of the carbide film, plural samples were produced by changing the amount of introduced methane gas between 5 sccm and 60 sccm under a constant Ar gas amount of 105 sccm. In the case of the nitride film, plural samples were produced by changing the amount of introduced nitrogen gas between 5 sccm and 60 sccm under a constant Ar gas amount of 105 sccm. In the case of the carbonitride film, plural samples were produced by changing the amount of each introduced gas between 5 sccm and 55 ccm under a condition in which the amount in total of introduced methane gas and nitrogen gas was not more than 60 sccm, under a constant Ar gas amount of 105 sccm. The maximum hardnesses of the rigid hard decorative members were determined. The maximum hardness of the carbide film in Table 2 is the hardness of the carbide film exhibiting the maximum value when the hardness of each carbide film produced by changing the amount of reaction gas is measured. The same also applies to the maximum hardnesses of the nitride film and the carbonitride film.

When a test for the corrosion resistance and etching properties of the rigid decorative members having the nitride film or the carbonitride film produced using sintered bodies of MoNb alloy was also conducted, the corrosion resistance and the etching properties were excellent in the same manner as in the case of the carbide film.

As listed in Table 2, the maximum hardness, the corrosion resistance, and the etching property are found to be changed depending on the alloy proportion and can be freely adjusted by the alloy proportion. The higher proportion of Mo is advantageous for scratch resistance because of resulting in increased brightness and also in improved adhesion to a base, and of enabling a film to be thick; however, in the case of single Mo or the high proportion of Mo, corrosion resistance is poor in a CASS test, and application as a decorative member is impossible. The high proportion of Nb results in higher film hardness and is advantageous for scratch resistance but results in low brightness, while in the case of single Nb, application as a decorative member is impossible since there is a problem with alkali resistance. Furthermore, in the case of single Nb, it is impossible to form a thick film since film stress is high and adhesion to a base is poor. Alloying of Mo and Nb enables the drawback of each of brightness, corrosion resistance, and adhesion to be compensated. For obtaining a white rigid decorative member excellent in the balance of a color sense, scratch resistance, and an anticorrosion property, the proportion of Mo is desirably 20 wt to 80 wt %, more desirably 30 to 70 wt %.

TABLE 2

| Proportion of Mo (wt %) | Proportion of Nb (wt %) | Carbide Film Maximum Hardness | Nitride Film Maximum Hardness | Carbonitride Film Maximum Hardness | Corrosion Resistance | | | Etching Property (1 μm) | | Overall Evaluation |
|---|---|---|---|---|---|---|---|---|---|---|
| | | | | | CASS 48 h | Artificial Sweat 48 h | Alkali | Hot Nitric Acid | Hot Nitric Acid + Fluorinated Acid | |
| 0 | 100 | 3151 | 2665 | | Good | Good | Fair | Poor | 430 sec | Fair |
| 30 | 70 | 2942 | 2670 | | Good | Good | Good | Poor | 260 sec | Good |
| 45 | 55 | 2845 | 2760 | 2810 | Good | Good | Good | Poor | 130 sec | Good |
| 70 | 30 | 2643 | 2710 | | Good | Good | Good | 500 sec | 80 sec | Good |
| 80 | 20 | 2617 | 2801 | 2710 | Fair | Good | Good | 420 sec | 50 sec | Fair |
| 100 | 0 | 2535 | 2325 | 2434 | Poor | Good | Good | 300 sec | 35 sec | Poor |

Mo and Nb included in the rigid decorative member 20 do not cause a metal allergy in exterior parts, for example, decorative parts and the like which are worn on the human body, such as watches, because of being materials that do not induce an allergic reaction in the human body.

The formation of a film in which Mo and Nb are alloyed enables compensation for the disadvantages of each of Mo and Nb and development of the advantages thereof, and makes it possible to provide a decorative member in which brightness, color saturation, hardness, corrosion resistance, etching properties, and anti-allergic properties can be freely controlled.

Example 2

Second Example of the present invention will be explained with reference to FIG. 6, FIG. 7, FIG. 8, FIG. 9, Table 3, and Table 4.

Figure 6:
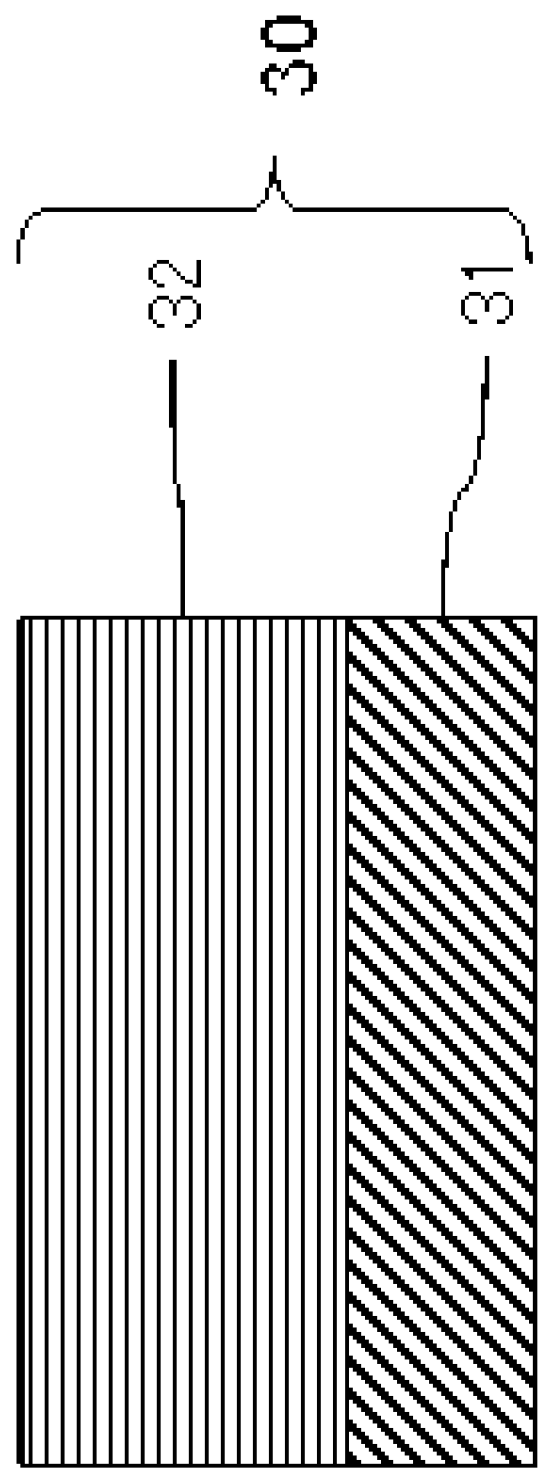
FIG. 6 illustrates a cross-sectional schematic view of a rigid decorative member 30.
Figure 7:
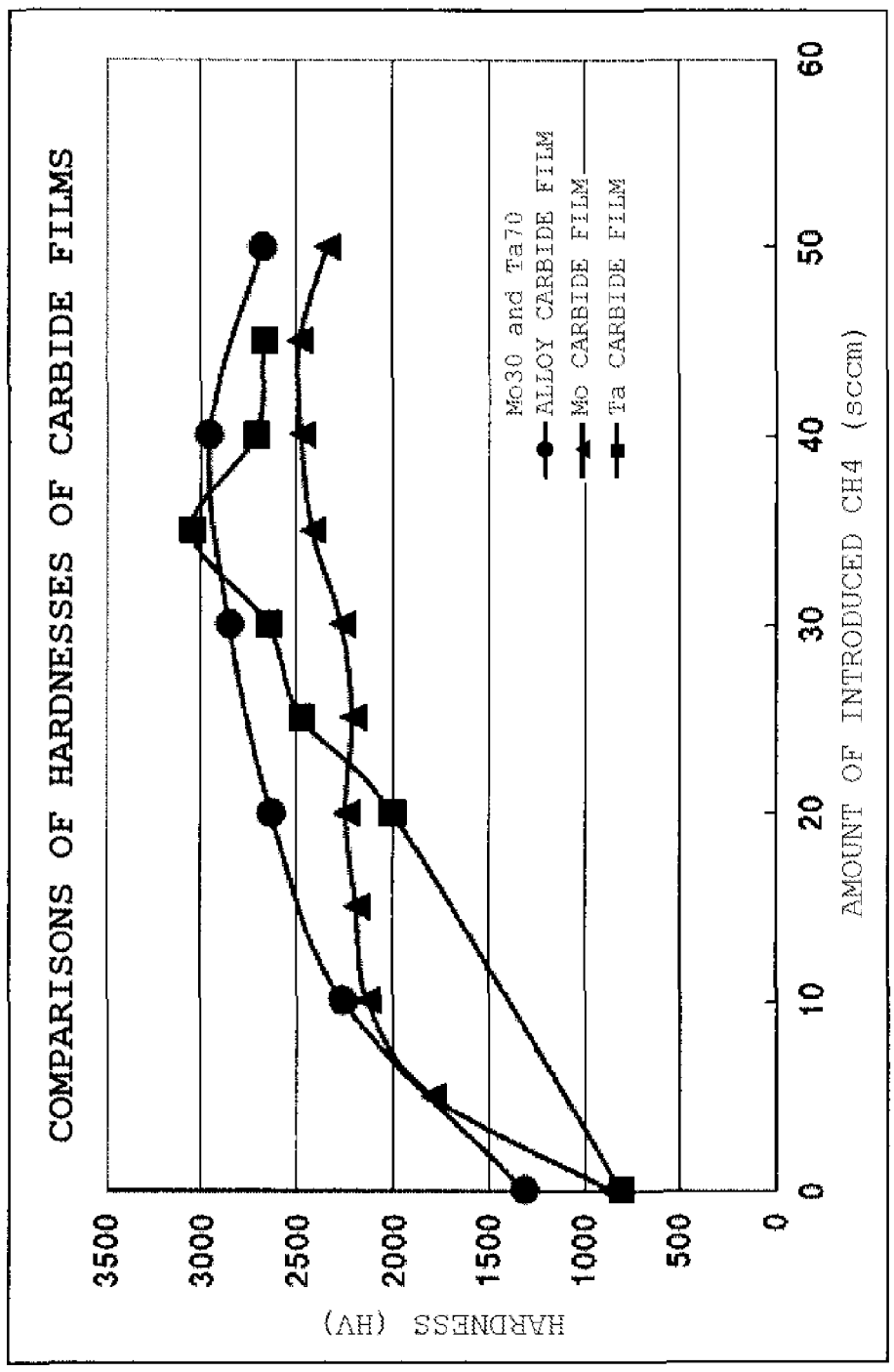
FIG. 7 is a view of a comparison of the film hardnesses of a rigid carbide film 32, a Mo carbide film, and a Ta carbide film, produced by changing the amount of methane gas.
Figure 8:
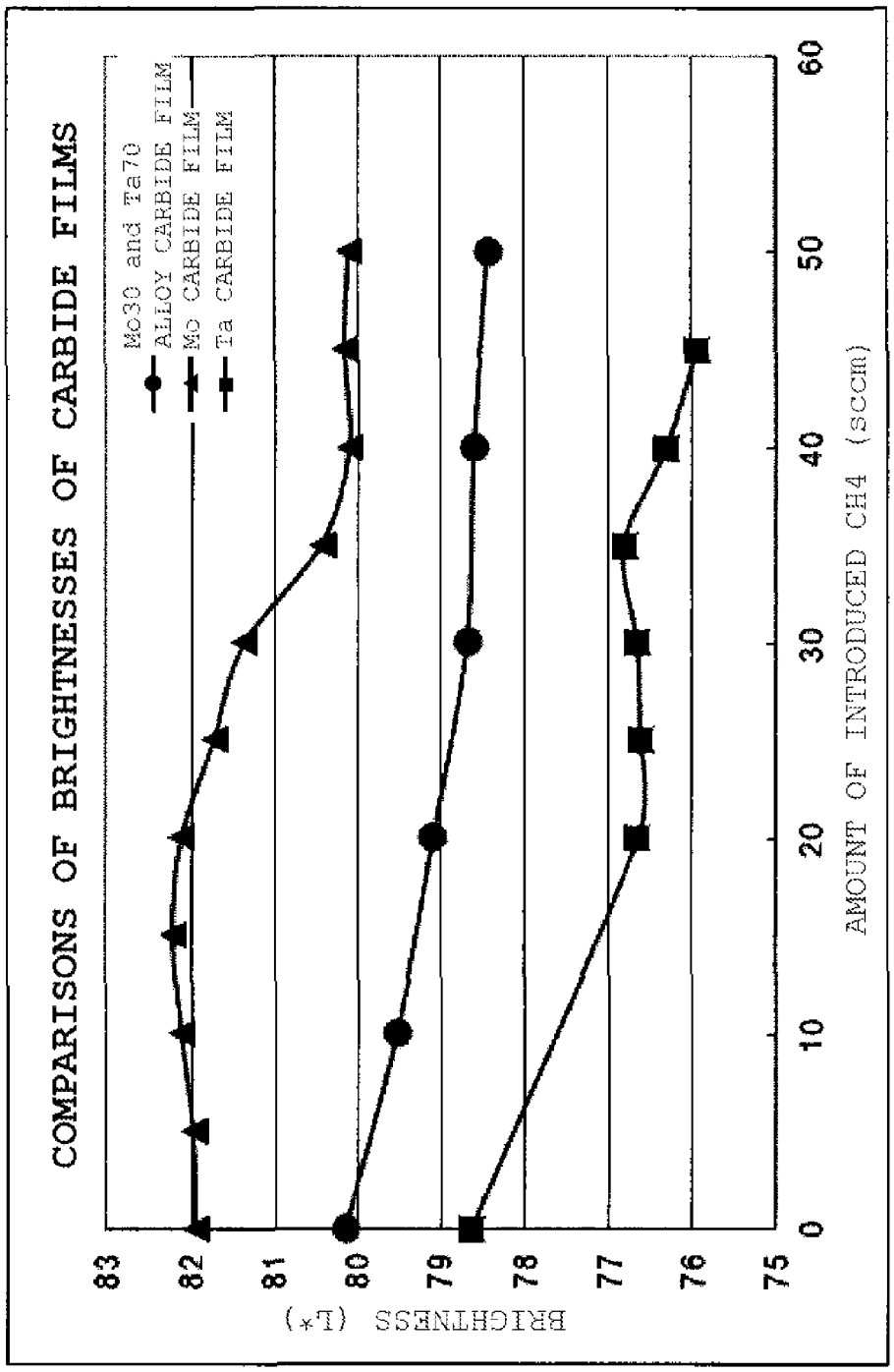
FIG. 8 is a view of a comparison of the brightnesses of the rigid carbide film 32, the Mo carbide film, and the Ta carbide film, produced by changing the amount of methane gas.
Figure 9:
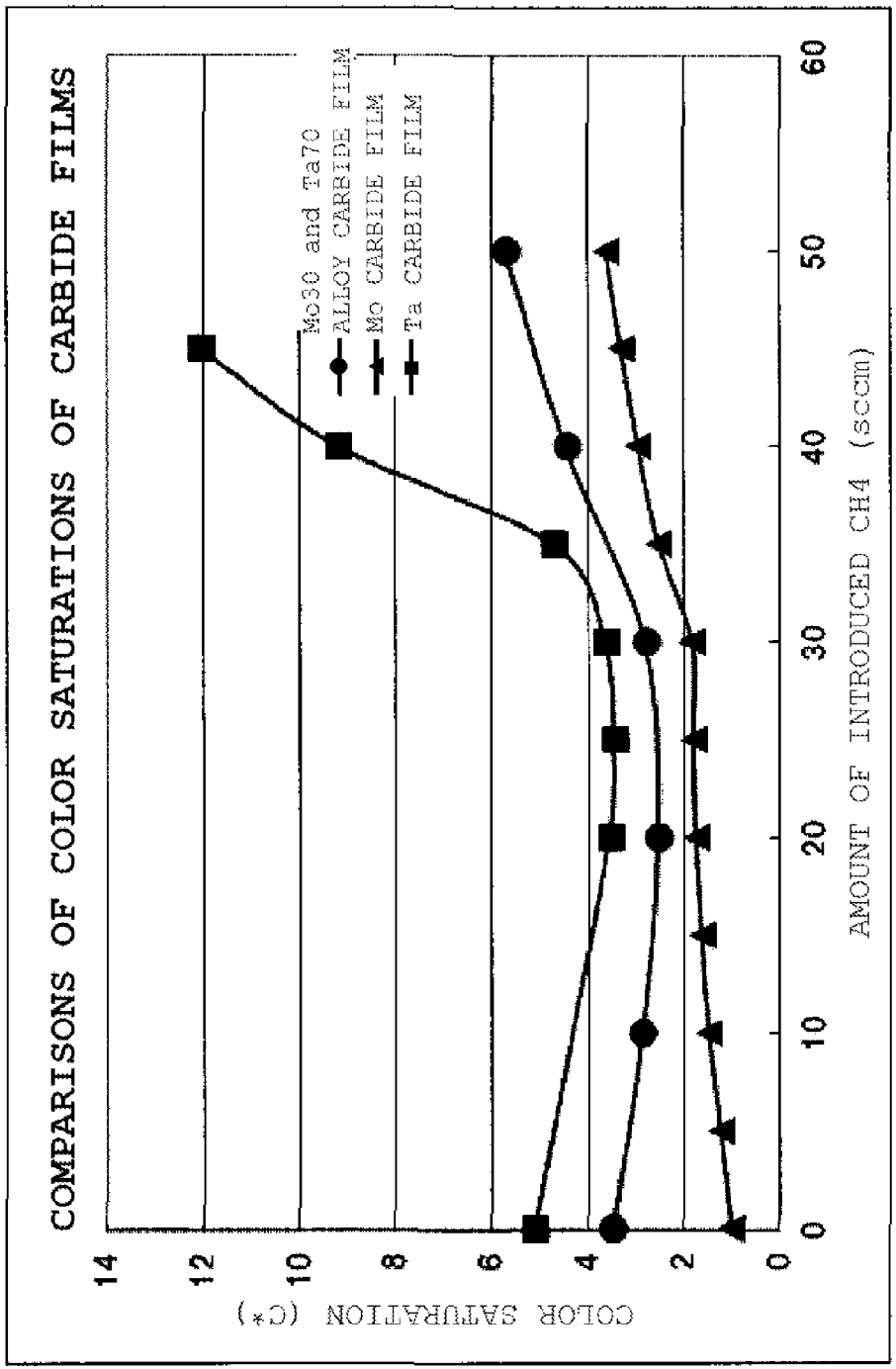
FIG. 9 is a view of a comparison of the color saturations of the rigid carbide film 32, the Mo carbide film, and the Ta carbide film, produced by changing the amount of methane gas.

FIG. 6 is a cross-sectional schematic view of a rigid decorative member 30, FIG. 7 is a view of comparisons of the film hardnesses of a rigid carbide film 32 (rigid coating layer), a Mo carbide film, and a Ta carbide film, which were produced by changing the amount of methane gas, FIG. 8 is a view of comparisons of the brightnesses of the rigid carbide film 32, the Mo carbide film, and the Ta carbide film, which were produced by changing the amount of methane gas, FIG. 9 is a view of comparisons of the color saturations of the rigid carbide film 32, the Mo carbide film, and the Ta carbide film, which were produced by changing the amount of methane gas, Table 3 is a table in which variations in diffraction angle obtained by measurement of the X-ray diffraction of carbide films produced by changing the proportions of Mo and Ta are listed, and Table 4 is a table of comparisons of maximum hardness, corrosion resistance performance, and etching performance in the case of changing the proportions of Mo and Ta.

(2-1) A sintered body of 30 wt % Mo and 70 wt % Ta as the composition of a sputtering target of Example 2 was used. An SUS316L material specified by JIS was used as a base 31, and a MoTa alloy carbide film of 1.5 μm was formed on the base 31 by introducing 30 sccm of methane gas under a constant Ar gas amount of 105 sccm by a sputtering method.

(2-2) FIG. 7 represents a view of the comparisons of the film hardness of the MoTa alloy carbide film produced by changing the amount of methane gas with those of the Ta carbide film and the Mo carbide film. The hardness of the MoTa alloy carbide film is found to exhibit obviously high hardness compared to that of the Mo carbide film and to also exhibit constant, high hardness compared to that of the Ta carbide film although the maximum hardness of the MoTa alloy carbide film is less than that of the Ta carbide film.

Since the scratch resistance performance is determined generally by the product of the hardness of the abrasion-resistant layer, the film thickness of the abrasion-resistant layer, the degree of adhesion to the base, and the hardness of the base, it is preferable to thickly form the film under the condition of the highest hardness. Therefore, the Ta carbide film is superior to the MoTa alloy carbide film from the viewpoint of film hardness; however, since the Ta carbide film has high film stress and also has poor adhesion to a substrate, the film having a film thickness of only around 1.0 μm can be formed. Conversely, since the Mo carbide film has low film stress and high adhesion to the substrate, peeling or the like does not occur even when the film of 3.0 μm or more is formed; however, since the film has low film hardness, it is impossible to obtain high scratch resistance performance. Since the MoTa alloy carbide film has the characteristics of both Mo and Ta, the film has high hardness and also has high adhesion to the base, therefore, the peeling of the film or the like does not occur even when the film of 2.0 or more is formed, and high scratch resistance performance is obtained.

FIG. 8 is a view of comparisons of the brightnesses of the films produced by changing the amount of methane gas in the MoTa alloy carbide film. The brightness of the MoTa alloy carbide film is found to substantially indicate the median value of those of the Mo carbide film and the Ta carbide film and to exhibit obviously high brightness compared to the Ta carbide film.

Examples of performances demanded in exterior parts include brightness. This is because higher brightness results in a higher grade. A white decorative member having a brightness (L*) of 78 or more is generally desired, and judging from the results of FIG. 8, the Ta carbide film has a brightness L* of less than 78, therefore, the Ta carbide film is almost gray rather than white, and a higher grade is not obtained. In the MoTa alloy carbide film, high brightness can be obtained by alloying Mo. In addition, the brightness can be freely adjusted by increasing the proportion of contained Mo.

FIG. 9 is a view of comparisons of the color saturations (C*) of the films produced by changing the amount of methane gas in the MoTa alloy carbide film. The color saturation of the MoTa alloy carbide film substantially indicates the median value of those of the Ta carbide film and the Mo carbide film. Since a color saturation (C*) that is closer to zero (0) is better in the case of a white color, the white decorative member on which the MoTa alloy carbide film of Example 2 is formed is found to have a white color compared to the Ta carbide film. Further, the Ta carbide film had a slightly brown-tinted color tone with increasing the amount of methane gas, while the MoTa alloy carbide film, in which increase of C* was suppressed, presented a constant, white color even when the amount of methane gas was increased. The color saturation can also be freely adjusted by the proportion of Mo and Ta in the same manner as in the case of the hardness or the brightness.

(2-3) In Table 3, the results of measurement of the X-ray diffraction of MoTa alloy carbide films produced by changing a MoTa alloy proportion are listed. In other words, rigid decorative members were produced in the same manner as in (2-1) except that sintered bodies in which the proportions of Mo and Ta are listed in Table 3 were used as sputtering targets. Since a diffraction peak is confirmed to shift depending on the proportions of Mo and Ta of which the solid solution at the whole rates is made, the formed MoTa alloy carbide films are considered to be alloys depending on the respective proportions.

sccm and 60 sccm under a constant Ar gas amount of 105 sccm. In the case of the carbonitride film, plural samples were produced by changing the amount of each introduced gas between 5 sccm and 55 ccm under a condition in which the amount in total of introduced methane gas and nitrogen gas was not more than 60 sccm, under a constant Ar gas amount of 105 sccm. The maximum hardnesses of the rigid hard decorative members were determined. The maximum hardness of the carbide film in Table 4 is the hardness of the carbide film exhibiting the maximum value when the hardness of each carbide film produced by changing the amount of reaction gas is measured. The same also applies to the maximum hardnesses of the nitride film and the carbonitride film.

When a test for the corrosion resistance and etching properties of the rigid decorative members having the nitride film or the carbonitride film produced using sintered bodies of MoTa alloy was also conducted, the corrosion resistance and the etching properties were excellent in the same manner as in the case of the carbide film.

As listed in Table 4, the maximum hardness, the corrosion resistance, and the etching property are found to be changed depending on the alloy proportion and can be freely adjusted by the alloy proportion. The higher proportion of Mo is advantageous for scratch resistance because of resulting in increased brightness and also in improved adhesion to a base, and of enabling a film to be thick; however, in the case of single Mo or the high proportion of Mo, corrosion resistance is poor in a CASS test, and application as a decorative member is impossible. The high proportion of Ta results in higher film hardness and is advantageous for scratch resistance but results in low brightness, and therefore application as a decorative member is impossible. In addi-

TABLE 3

| Film Composition | Proportion of Mo (wt %) | Proportion of Ta (wt %) | Carbide Diffraction Peak (hkl) | | | | |
| --- | --- | --- | --- | --- | --- | --- | --- |
| | | | (111) | (200) | (220) | (311) | (222) |
| MoC film | 100 | 0 | 36.50 | 41.96 | 61.08 | 73.10 | 76.88 |
| MoTaC film (sample 2) | 70 | 30 | 35.81 | 41.37 | 60.01 | 72.08 | 75.77 |
| MoTaC film (sample 2) | 30 | 70 | 34.95 | 40.759 | 58.876 | 70.648 | 73.931 |
| TaC film | 0 | 100 | 34.44 | 40.16 | 58.18 | 69.82 | 73.12 |

(2-4) In Table 4, the hardnesses of a carbide film, a nitride film, and a carbonitride film, corrosion resistances, etching properties, and overall evaluations are listed with respect to MoTa alloy proportions. In other words, rigid decorative members having carbide films were produced in the same manner as in (2-1) except that sintered bodies of which the proportions of Mo and Ta are listed in Table 4 were used as sputtering targets. A test for the corrosion resistances and etching properties of the rigid decorative members was conducted.

In addition, rigid decorative members having a carbide film, a nitride film, and a carbonitride film were produced by changing the kind and amount of gas. In the case of the carbide film, plural samples were produced by changing the amount of introduced methane gas between 5 sccm and 60 sccm under a constant Ar gas amount of 105 sccm. In the case of the nitride film, plural samples were produced by changing the amount of introduced nitrogen gas between 5 tion, in the case of single Ta, adhesion to a base is poor, and it is impossible to form a thick film. Alloying of Mo and Ta enables the drawback of each of brightness, corrosion resistance, and adhesion to be compensated.

It is meant that in the rigid decorative member 30 obtained in Example 2, etching time is long and corrosion resistance is high compared to the MoNb alloy film of Example 1. This is because Ta metal is a material superior in corrosion resistance to Nb metal. In addition, in the case of single Ta, film stress is high and adhesion to a base is poor, and it is impossible to form a thick film. Alloying of Mo and Ta enables the drawback of each of brightness, corrosion resistance, and adhesion to be compensated. For obtaining a white rigid decorative member excellent in the balance of a color sense, scratch resistance, and an anticorrosion property, the proportion of Mo is desirably 20 wt to 80 wt %, more desirably 30 to 70 wt %.

TABLE 4

| Proportion of Mo (wt %) | Proportion of Ta (wt %) | Carbide Film Maximum Hardness | Nitride Film Maximum Hardness | Carbonitride Film Maximum Hardness | Corrosion Resistance | | | Etching Property (1 μm) | | Overall Evaluation |
|---|---|---|---|---|---|---|---|---|---|---|
| | | | | | CASS 48 h | Artificial Sweat 48 h | Alkali | Hot Nitric Acid | Hot Nitric Acid + Fluorinated Acid | |
| 0 | 100 | 3051 | 2714 | | Good | Good | Good | Poor | 710 sec | Fair |
| 30 | 70 | 2963 | 2757 | 2847 | Good | Good | Good | Poor | 640 sec | Good |
| 70 | 30 | 2777 | 2789 | 2800 | Good | Good | Good | Poor | 160 sec | Good |
| 100 | 0 | 2535 | 2325 | 2694 | Poor | Good | Good | 300 sec | 35 sec | Poor |

Mo and Ta included in the rigid decorative member 30 do not cause a metal allergy in exterior parts, for example, decorative parts and the like which are worn on the human body, such as watches, because of being materials that do not induce an allergic reaction in the human body.

The formation of a film in which Mo and Ta are alloyed enables compensation for the disadvantages of each of Mo and Ta and development of the advantages thereof, and makes it possible to provide a decorative member in which brightness, color saturation, hardness, corrosion resistance, etching properties, and anti-allergic properties can be freely controlled.

Example 3

Third Example of the present invention will be explained with reference to FIG. 10, FIG. 11, FIG. 12, FIG. 13, and Table 5.

Figure 10:
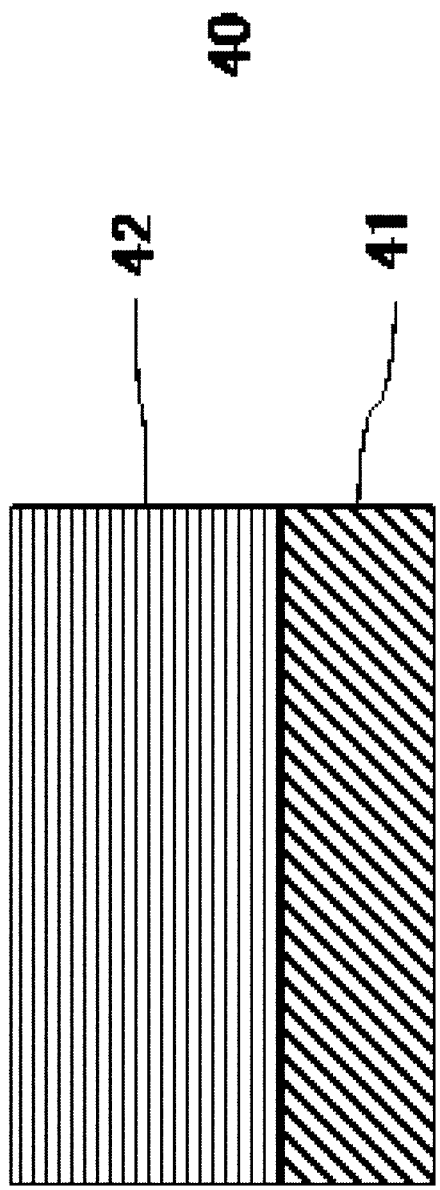
FIG. 10 illustrates a cross-sectional schematic view of a rigid decorative member 40.
Figure 11:
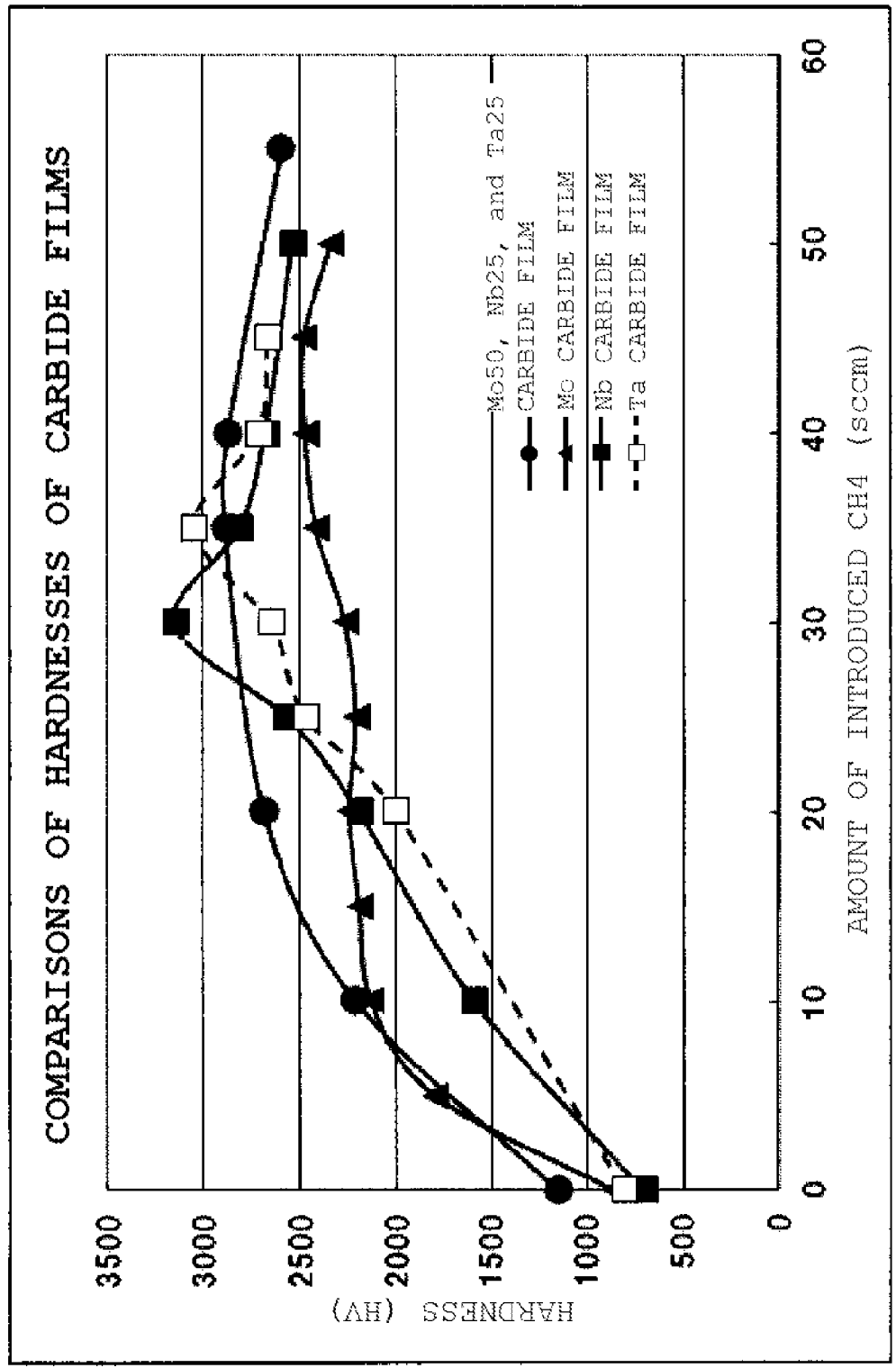
FIG. 11 is a view of a comparison of the film hardnesses of a rigid carbide film 42, a Mo carbide film, a Nb carbide film, and a Ta carbide film, produced by changing the amount of methane gas.
Figure 12:
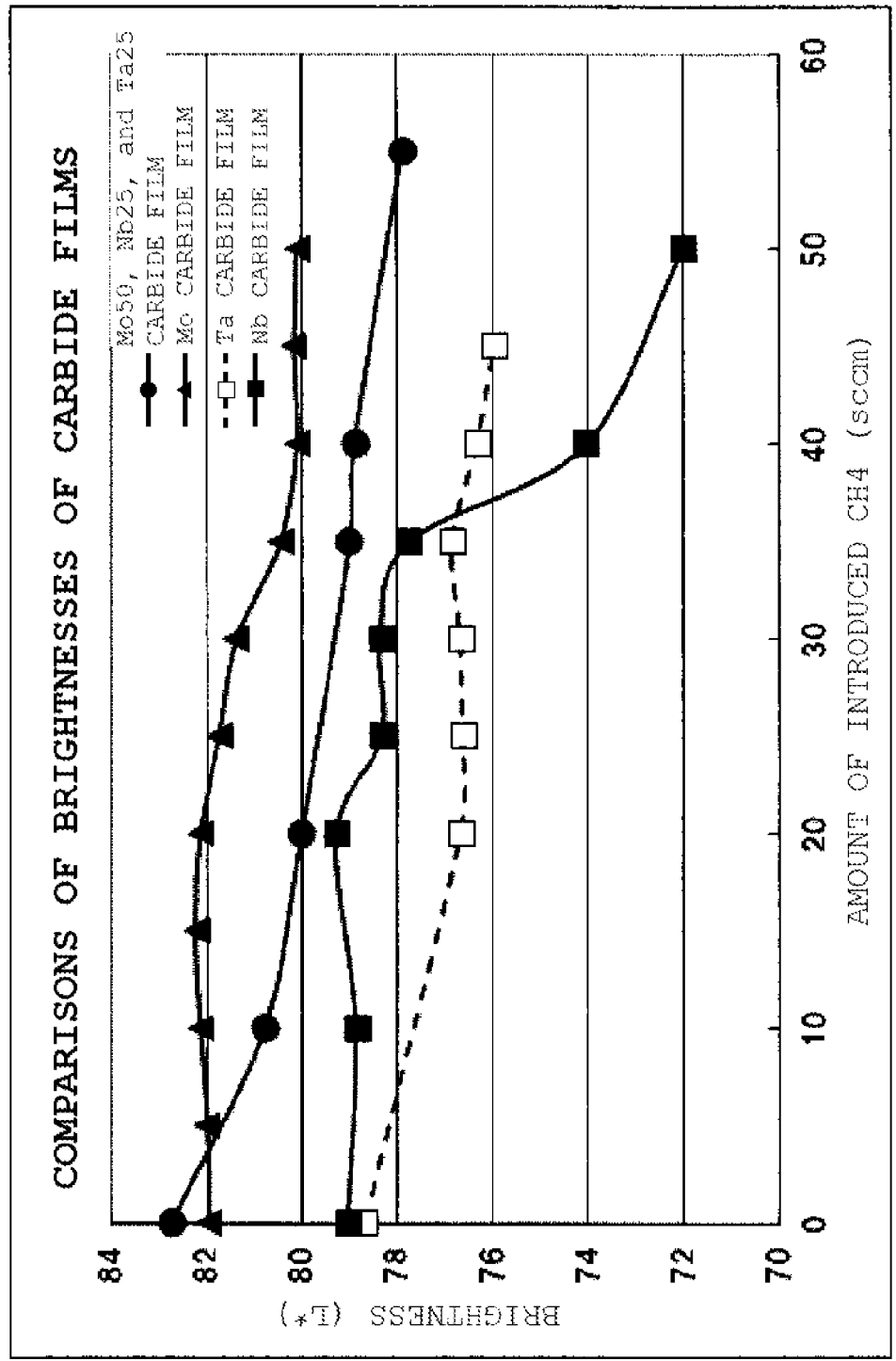
FIG. 12 is a view of a comparison of the brightnesses of the rigid carbide film 42, the Mo carbide film, the Nb carbide film, and the Ta carbide film, produced by changing the amount of methane gas.
Figure 13:
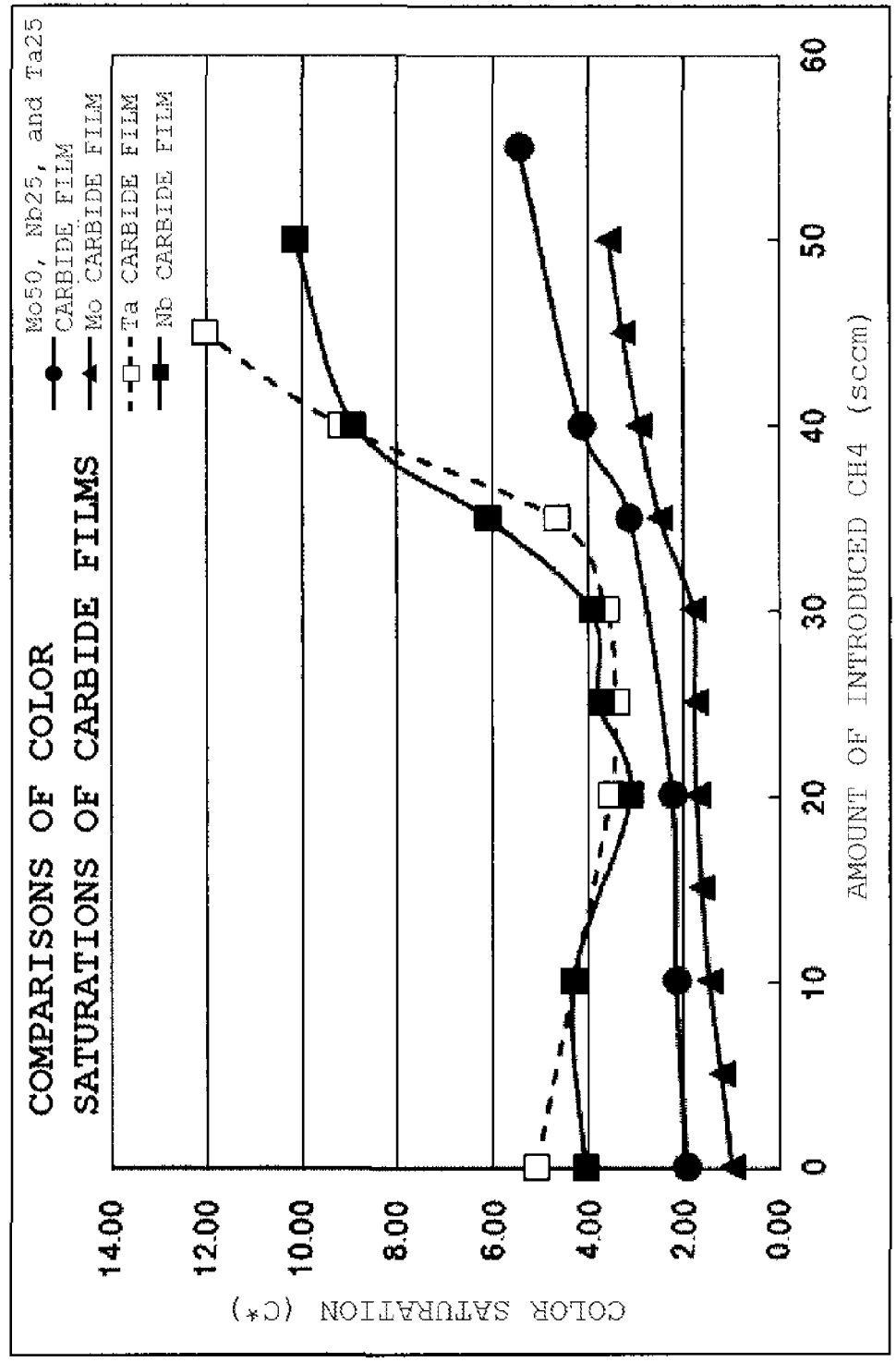
FIG. 13 is a view of a comparison of the color saturations of the rigid carbide film 42, the Mo carbide film, the Nb carbide film, and the Ta carbide film, produced by changing the amount of methane gas.

FIG. 10 is a cross-sectional schematic view of a rigid decorative member 40, FIG. 11 is a view of comparisons of the film hardnesses of a rigid carbide film 42 (rigid coating layer), a Mo carbide film, a Nb carbide film, and a Ta carbide film, which were produced by changing the amount of methane gas, FIG. 12 is a view of comparisons of the brightnesses of the rigid carbide film 42, the Mo carbide film, the Nb carbide film, and the Ta carbide film, which were produced by changing the amount of methane gas, FIG. 13 is a view of comparisons of the color saturations of the rigid carbide film 42, the Mo carbide film, the Nb carbide film, and the Ta carbide film, which were produced by changing the amount of methane gas, and Table 5 is a table of comparisons of maximum hardness, corrosion resistance performance, and etching performance in the case of changing the proportions of Mo, Nb, and Ta.

(3-1) A sintered body of 50 wt % Mo, 25 wt % Nb, and 25 wt % Ta as the composition of a sputtering target of Example 3 was used. A Class 2 titanium material specified by JIS was used as a base 41, and a MoNbTa alloy carbide film of 1.6 μm was formed on the base 41 by introducing 35 sccm of methane gas under a constant Ar gas amount of 105 sccm by a sputtering method.

(3-2) FIG. 11 represents a view of the comparisons of the film hardness of the MoNbTa alloy carbide film produced by changing the amount of methane gas with those of the Nb carbide film, the Ta carbide film, and the Mo carbide film. The hardness of the MoNbTa alloy carbide film is found to exhibit obviously high hardness compared to that of the Mo carbide film and to also exhibit high hardness in an overall methane gas range compared to those of the Nb carbide film and the Ta carbide film although the maximum hardness of the MoNbTa alloy carbide film is less than those of the Nb carbide film and the Ta carbide film.

Since the scratch resistance performance is determined generally by the product of the hardness of the abrasion-resistant layer, the film thickness of the abrasion-resistant layer, the degree of adhesion to the base, and the hardness of the base, it is preferable to thickly form the film under the condition of the highest hardness. Therefore, the use of the conditions of the maximum hardnesses of the Nb carbide film and the Ta carbide film is superior to the MoNbTa alloy carbide film from the viewpoint of film hardness; however, since the Nb carbide film and the Ta carbide film have high film stress and also have poor adhesion to a substrate, the film having a film thickness of only around 1.0 μm can be formed. Conversely, since the Mo carbide film has low film stress and high adhesion to the substrate, peeling or the like does not occur even when the film of 3.0 μm or more is formed; however, since the film has low film hardness, it is impossible to obtain high scratch resistance performance. Since the MoNbTa alloy carbide film has the characteristics of all of Mo, Nb, and Ta, the film has high hardness and also has high adhesion to the base, therefore, the peeling of the film or the like does not occur even when the film of 2.0 μm or more is formed, and high scratch resistance performance is thus obtained.

FIG. 12 is a view of comparisons of the brightnesses of the films produced by changing the amount of methane gas in the MoNbTa alloy carbide film. The brightness of the MoNbTa alloy carbide film exhibited obviously high brightness compared to the Nb carbide film and the Ta carbide film.

Examples of performances demanded in exterior parts include brightness. This is because higher brightness results in a higher grade. A white decorative member having a brightness (L*) of 78 or more is generally desired, and judging from the results of FIG. 12, the Nb carbide film and the Ta carbide film have a brightness L* of less than 78, therefore, the Nb carbide film and the Ta carbide film are almost gray rather than white, and a higher grade is not obtained. In the MoNbTa alloy carbide film, high brightness can be obtained by alloying Mo. In addition, the brightness can be freely adjusted by increasing the proportion of contained Mo.

FIG. 13 is a view of comparisons of the color saturations (C*) of the films produced by changing the amount of methane gas in the MoNbTa alloy carbide film. The color saturation of the MoNbTa alloy carbide film was substantially equivalent to that of the Mo carbide film. Since a color saturation (C*) that is closer to zero (0) is better in the case of a white color, the white decorative member on which the MoNbTa alloy carbide film of Example 3 is formed is found to have a white color compared to the Nb carbide film and the Ta carbide film. Further, the Nb carbide film and the Ta carbide film had a slightly brown-tinted color tone with increasing the amount of methane gas, while the MoNbTa alloy carbide film, in which increase of C* was suppressed, presented a constant, white color even when the amount of methane gas was increased. The color saturation can also be freely adjusted by the proportion of Mo, Nb, and Ta.

(3-3) In Table 5, the hardnesses of a carbide film and a nitride film, corrosion resistances, etching properties, and overall evaluations are listed with respect to MoNbTa alloy proportions. In other words, rigid decorative members having carbide films were produced in the same manner as in (3-1) except that sintered bodies of which the proportions of Mo, Nb, and Ta are listed in Table 5 were used as sputtering targets. A test for the corrosion resistances and etching properties of the rigid decorative members was conducted.

In addition, rigid decorative members having a carbide film and a nitride film were produced by changing the kind and amount of gas. In the case of the carbide film, plural samples were produced by changing the amount of introduced methane gas between 5 sccm and 60 sccm under a constant Ar gas amount of 105 sccm. In the case of the nitride film, plural samples were produced by changing the amount of introduced nitrogen gas between 5 sccm and 60 sccm under a constant Ar gas amount of 105 sccm. The maximum hardnesses of the rigid hard decorative members were determined. The maximum hardness of the carbide film in Table 5 is the hardness of the carbide film exhibiting the maximum value when the hardness of each carbide film produced by changing the amount of reaction gas is measured. The same also applies to the maximum hardness of the nitride film.

When a test for the corrosion resistance and etching properties of the rigid decorative members having the nitride film produced using sintered bodies of MoNbTa alloy was also conducted, the corrosion resistance and the etching properties were excellent in the same manner as in the case of the carbide film.

As listed in Table 5, the maximum hardness, the corrosion resistance, and the etching property are found to be changed depending on the alloy proportion and can be freely adjusted by the alloy proportion. The higher proportion of Mo is advantageous for scratch resistance because of resulting in increased brightness and also in improved adhesion to a base, and of enabling a film to be thick; however, in the case of single Mo or the high proportion of Mo, corrosion resistance is poor in a CASS test, and application as a decorative member is impossible. Similarly, in the case of single Nb, the single use is impossible since corrosion resistance to an alkali is poor. The high proportions of Nb and Ta result in higher film hardness and are advantageous for scratch resistance but result in low brightness, and therefore application as a decorative member is impossible.

In addition, in the case of single Nb and Ta, adhesion to a base is poor, film stress is significantly high, and therefore, it is impossible to form a thick film. Alloying of Mo, Nb, and Ta enables the drawback of each of brightness, corrosion resistance, and adhesion to be compensated. For obtaining a white rigid decorative member excellent in the balance of a color tone, scratch resistance, and an anticorrosion property, the proportion of Mo is desirably 20 wt to 80 wt %, more desirably 30 to 70 wt %.

TABLE 5

| Proportion of Mo (wt %) | Proportion of Nb (wt %) | Proportion of Ta (wt %) | Carbide Film Maximum Hardness | Nitride Film Maximum Hardness | Corrosion Resistance | | | Etching Property (1 μm) | | Overall Evaluation |
|---|---|---|---|---|---|---|---|---|---|---|
| | | | | | CASS 48 h | Artificial Sweat 48 h | Alkali | Hot Nitric Acid | Hot Nitric Acid + Fluorinated Acid | |
| 0 | 0 | 100 | 3101 | 2714 | Good | Good | Good | Poor | 710 sec | Fair |
| 0 | 100 | 0 | 3151 | 2665 | Good | Good | Fair | Poor | 430 sec | Fair |
| 100 | 0 | 0 | 2535 | 2325 | Poor | Good | Good | 300 sec | 35 sec | Poor |
| 50 | 25 | 25 | 2897 | 2799 | Good | Good | Good | Poor | 240 sec | Good |

Mo, Nb, and Ta included in the rigid decorative member 40 do not cause a metal allergy in exterior parts, for example, decorative parts and the like which are worn on the human body, such as watches, because of being materials that do not induce an allergic reaction in the human body.

The formation of a film in which Mo, Nb, and Ta are alloyed enables compensation for the disadvantages of each of Mo, Nb, and Ta and development of the advantages thereof, and makes it possible to provide a decorative member in which brightness, color saturation, hardness, corrosion resistance, etching properties, and anti-allergic properties can be freely controlled.

Example 4

Fourth Example of the present invention will be explained with reference to FIG. 14, FIG. 15, FIG. 16, FIG. 17, and Table 6.

Figure 14:
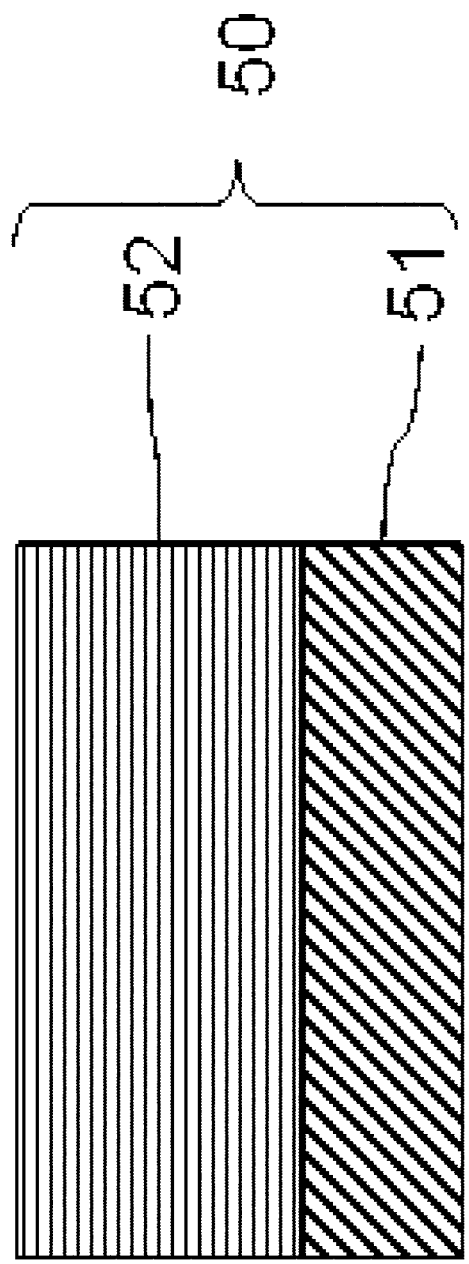
FIG. 14 illustrates a cross-sectional schematic view of a rigid decorative member 50.
Figure 15:
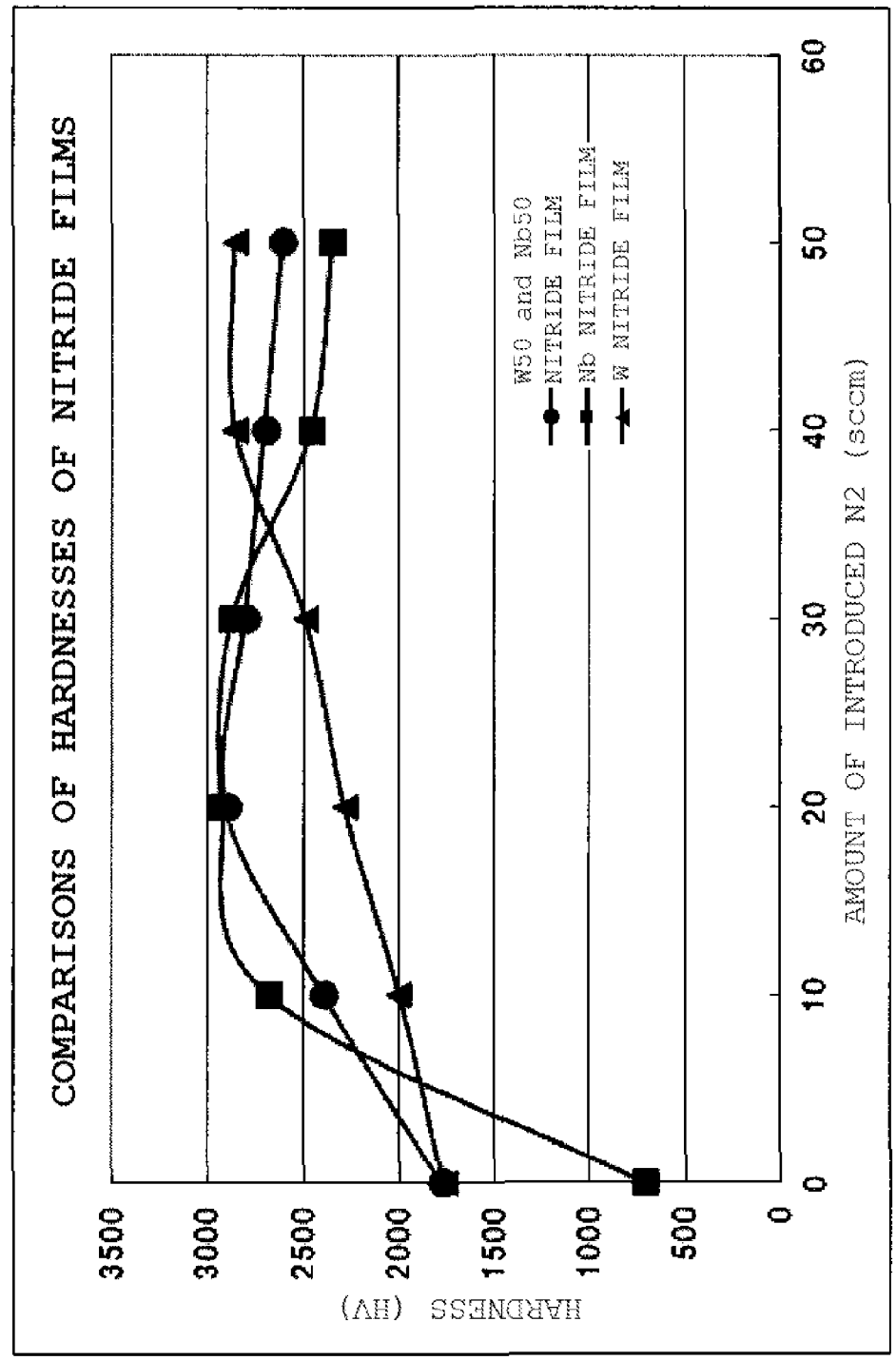
FIG. 15 is a view of a comparison of the film hardnesses of a rigid nitride film 52, a W nitride film, and a Nb nitride film, produced by changing the amount of nitrogen gas.
Figure 16:
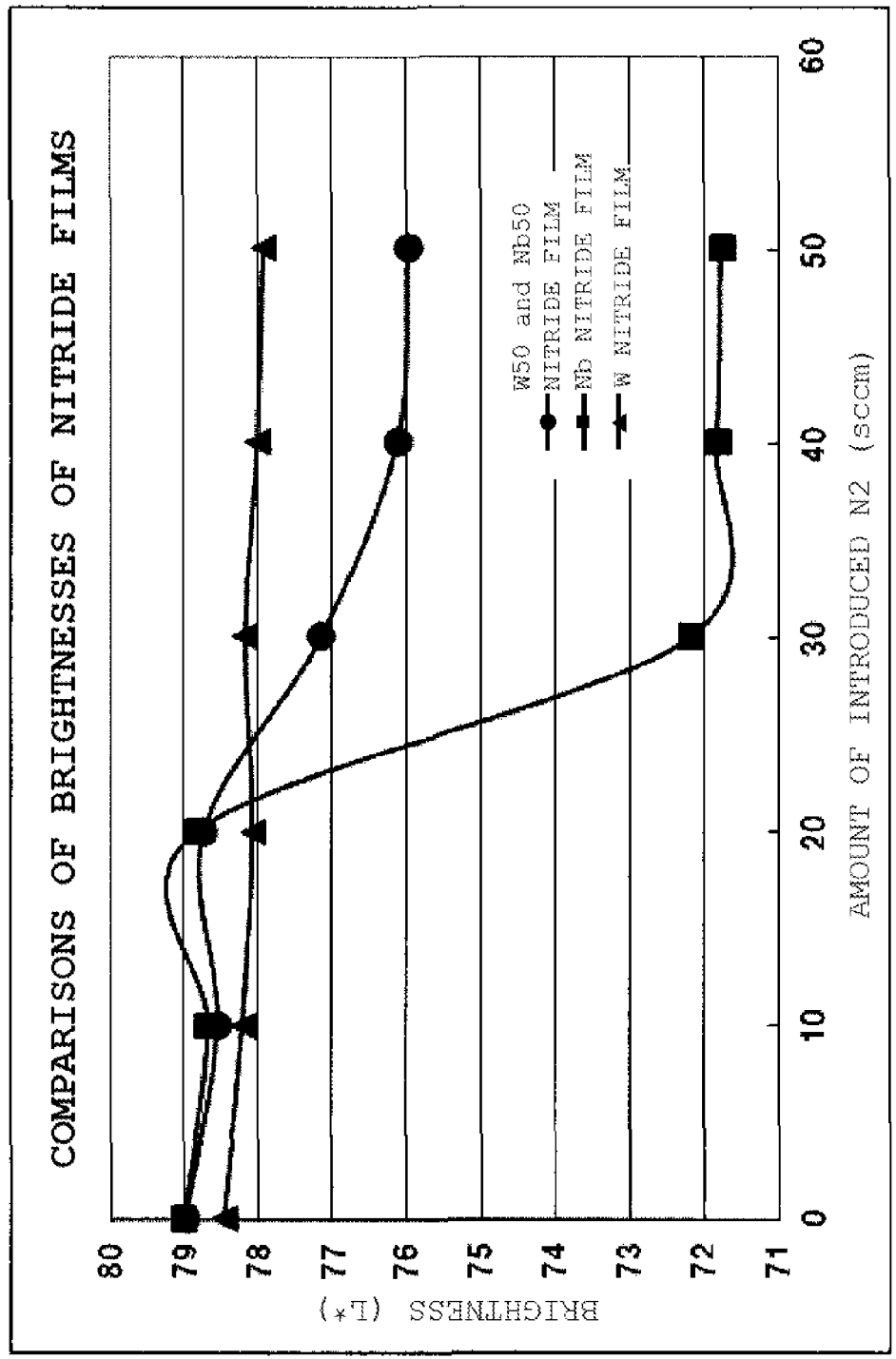
FIG. 16 is a view of a comparison of the brightnesses of the rigid nitride film 52, the W nitride film, and the Nb nitride film, produced by changing the amount of nitrogen gas.
Figure 17:
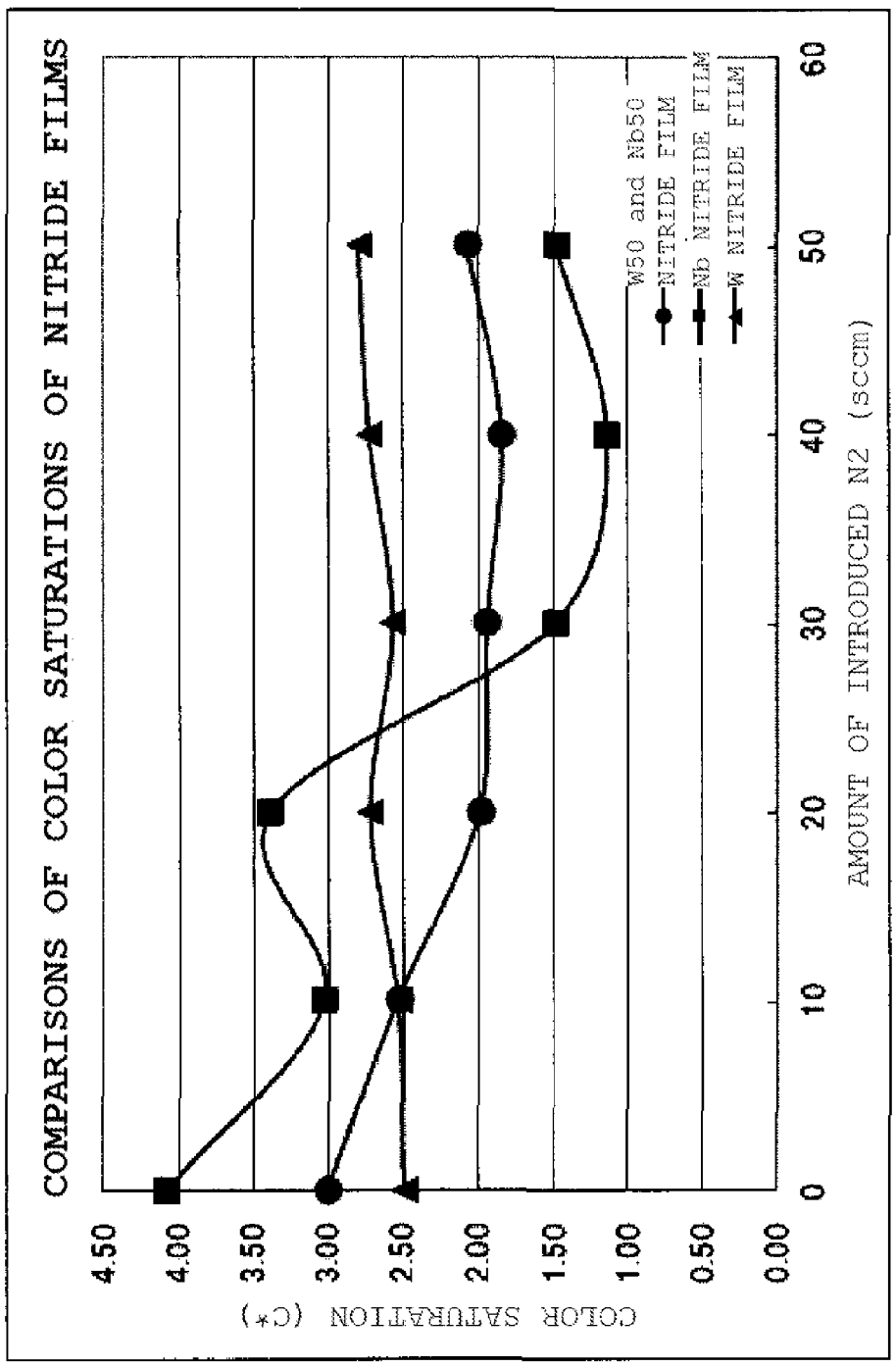
FIG. 17 is a view of a comparison of the color saturations of the rigid nitride film 52, the W nitride film, and the Nb nitride film, produced by changing the amount of nitrogen gas.

FIG. 14 is a cross-sectional schematic view of a white rigid decorative member 50, FIG. 15 is a view of comparisons of the film hardnesses of a rigid carbide film 52 (rigid coating layer), a W nitride film, and a Nb nitride film, which were produced by changing the amount of nitrogen gas, FIG. 16 is a view of comparisons of the brightnesses of the rigid carbide film 52, the W nitride film, and the Nb nitride film, which were produced by changing the amount of nitrogen gas, FIG. 17 is a view of comparisons of the color saturations of the rigid carbide film 52, the W nitride film, and the Nb nitride film, which were produced by changing the amount of nitrogen gas, and Table 6 is a table of comparisons of maximum hardness, corrosion resistance performance, and etching performance in the case of changing the proportions of W and Nb.

(4-1) A sintered body of 50 wt % W and 50 wt % Nb as the composition of a sputtering target of Example 4 was used. An SUS316L material specified by JIS was used as a base 51, and a WNb alloy nitride film of 1.5 μm was formed on the base 51 by introducing 20 sccm of nitrogen gas under a constant Ar gas amount of 105 sccm by a sputtering method.

(4-2) FIG. 15 represents a view of the comparisons of the film hardness of the WNb alloy nitride film produced by changing the amount of nitrogen gas with those of the W nitride film and the Nb nitride film. The hardness of the WNb alloy nitride film is found to exhibit high hardness in an overall nitrogen gas range.

Since the scratch resistance performance is determined generally by the product of the hardness of the abrasion-resistant layer, the film thickness of the abrasion-resistant layer, the degree of adhesion to the base, and the hardness of the base, it is preferable to thickly form the film under the condition of the highest hardness. Therefore, the W nitride film and the Nb nitride film are superior to the WNb alloy nitride film from the viewpoint of film hardness; however, since the Nb nitride film has high film stress and also have poor adhesion to a substrate, the film having a film thickness of only around 1.0 μm can be formed. Although the W nitride film also has high film stress and is not excellent in adhesion in a high nitrogen gas range, the W nitride film has low film stress and high adhesion to the base in a low nitrogen gas range. Since the WNb alloy nitride film exhibits constant, high film hardness particularly from a low nitrogen gas range and has low film stress in the low nitrogen gas range, the film is not peeled even when the film of 1.8 μm or more is formed, and therefore high scratch resistance performance is obtained compared to the case of singly using each metal nitride film.

FIG. 16 is a view of comparisons of the brightnesses of the films produced by changing the amount of nitrogen gas in the WNb alloy nitride film. The brightness of the WNb alloy nitride film exhibited the median value of the brightnesses of both of the W nitride film and the Nb nitride film.

Examples of performances demanded in exterior parts include brightness. This is because higher brightness results in a higher grade. A white decorative member having a brightness (L*) of 78 or more is generally desired, and judging from the results of FIG. 16, and the brightness corresponds to a range in which a nitrogen gas is 20 sccm or less in the WNb alloy nitride film.

FIG. 17 is a view of comparisons of the color saturations (C*) of the films produced by changing the amount of nitrogen gas in the WNb alloy nitride film. The color saturation of the WNb alloy nitride film substantially exhibited the median value of those of the W nitride film and the Nb nitride film. Since a color saturation (C*) that is closer to zero (0) is better in the case of a white color, the white decorative member on which the WNb alloy nitride film of Example 4 is formed is found to have a white color in an overall nitrogen gas amount.

(4-3) In Table 6, the hardnesses of a carbide film and a nitride film, corrosion resistances, etching properties, and overall evaluations are listed with respect to WNb alloy proportions. In other words, rigid decorative members having nitride films were produced in the same manner as in (4-1) except that sintered bodies of which the proportions of W and Nb are listed in Table 6 were used as sputtering targets. A test for the corrosion resistances and etching properties of the rigid decorative members was conducted.

In addition, rigid decorative members having a nitride film and a carbide film were produced by changing the kind and amount of gas. In the case of the nitride film, plural samples were produced by changing the amount of introduced nitrogen gas between 5 sccm and 60 sccm under a constant Ar gas amount of 105 sccm. In the case of the carbide film, plural samples were produced by changing the amount of introduced methane gas between 5 sccm and 60 sccm under a constant Ar gas amount of 105 sccm. The maximum hardnesses of the rigid hard decorative members were determined. The maximum hardness of the nitride film in Table 6 is the hardness of the nitride film exhibiting the maximum value when the hardness of each nitride film produced by changing the amount of reaction gas is measured. The same also applies to the maximum hardness of the carbide film.

When a test for the corrosion resistance and etching properties of the rigid decorative members having the carbide film produced using sintered bodies of WNb alloy was also conducted, the corrosion resistance and the etching properties were excellent in the same manner as in the case of the nitride film.

As listed in Table 6, the maximum hardness, the corrosion resistance, and the etching property are found to be changed depending on the alloy proportion and can be freely adjusted by the alloy proportion. In the case of single W, corrosion resistance is poor in a CASS test, and application as a decorative member is impossible. Similarly, in the case of single Nb, the single use is impossible since corrosion resistance to an alkali is poor. Alloying of W and Nb enables the drawback of each of brightness, corrosion resistance, and adhesion to be compensated.

The nitride film of W or Nb exhibits high hardness in itself while being a material also having high film stress. Since film stress depends on the amount of introduced nitrogen gas, the film stress is high and adhesion is poor in a high nitrogen gas range. The WNb alloy nitride film is a material having high hardness in a low nitrogen gas range, high adhesion of W compared to Nb in the range, and, in addition, low film stress, the thick film can be formed, and a white decorative member excellent in scratch resistance can be provided.

For obtaining a white decorative member excellent in the balance of a color tone, scratch resistance, and an anticorrosion property, the proportion of W is desirably 30 wt to 70 wt %, more desirably 40 to 60 wt %.

TABLE 6

| Proportion of W (wt %) | Proportion of Nb (wt %) | Nitride Film Maximum Hardness | Carbide Film Maximum Hardness | Corrosion Resistance | | | Etching Property (1 μm) | | Overall Evaluation |
|---|---|---|---|---|---|---|---|---|---|
| | | | | CASS 48 h | Artificial Sweat 48 h | Alkali | Hot Nitric Acid | Hot Nitric Acid + Fluorinated Acid | |
| 100 | 0 | 2862 | 2890 | Fair | Good | Good | 250 sec | 30 sec | Fair |
| 0 | 100 | 2920 | 3151 | Good | Good | Fair | Poor | 430 sec | Fair |
| 50 | 50 | 2894 | 2931 | Good | Good | Good | Poor | 310 sec | Good |

W and Nb included in the rigid decorative member 50 do not cause a metal allergy in exterior parts, for example, decorative parts and the like which are worn on the human body, such as watches, because of being materials that do not induce an allergic reaction in the human body.

The formation of a film in which W and Nb of which the solid solution at the whole rates is made are alloyed enables compensation for the disadvantages of each of W and Nb and development of the advantages thereof, and makes it possible to provide a decorative member in which brightness, color saturation, hardness, corrosion resistance, etching properties, and anti-allergic properties can be freely controlled.

Example 5

Fifth Example of the present invention will be explained with reference to FIG. 18, FIG. 19, FIG. 20, FIG. 21, Table 7, and Table 8.

Figure 18:
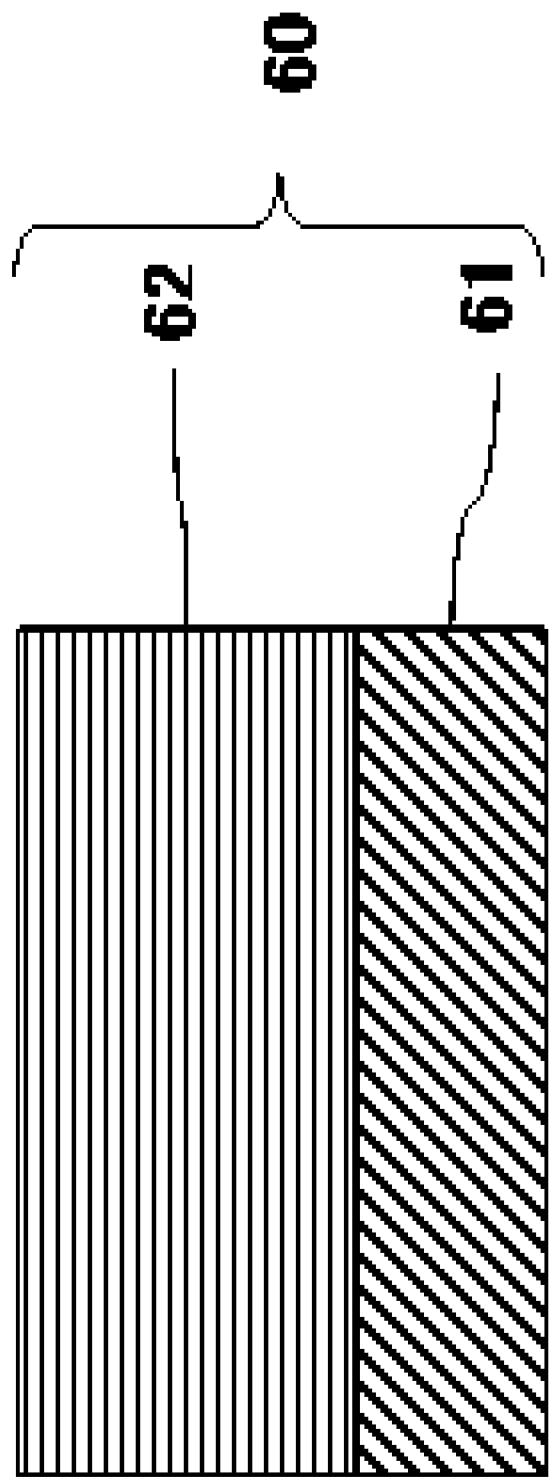
FIG. 18 illustrates a cross-sectional schematic view of a rigid decorative member 60.
Figure 19:
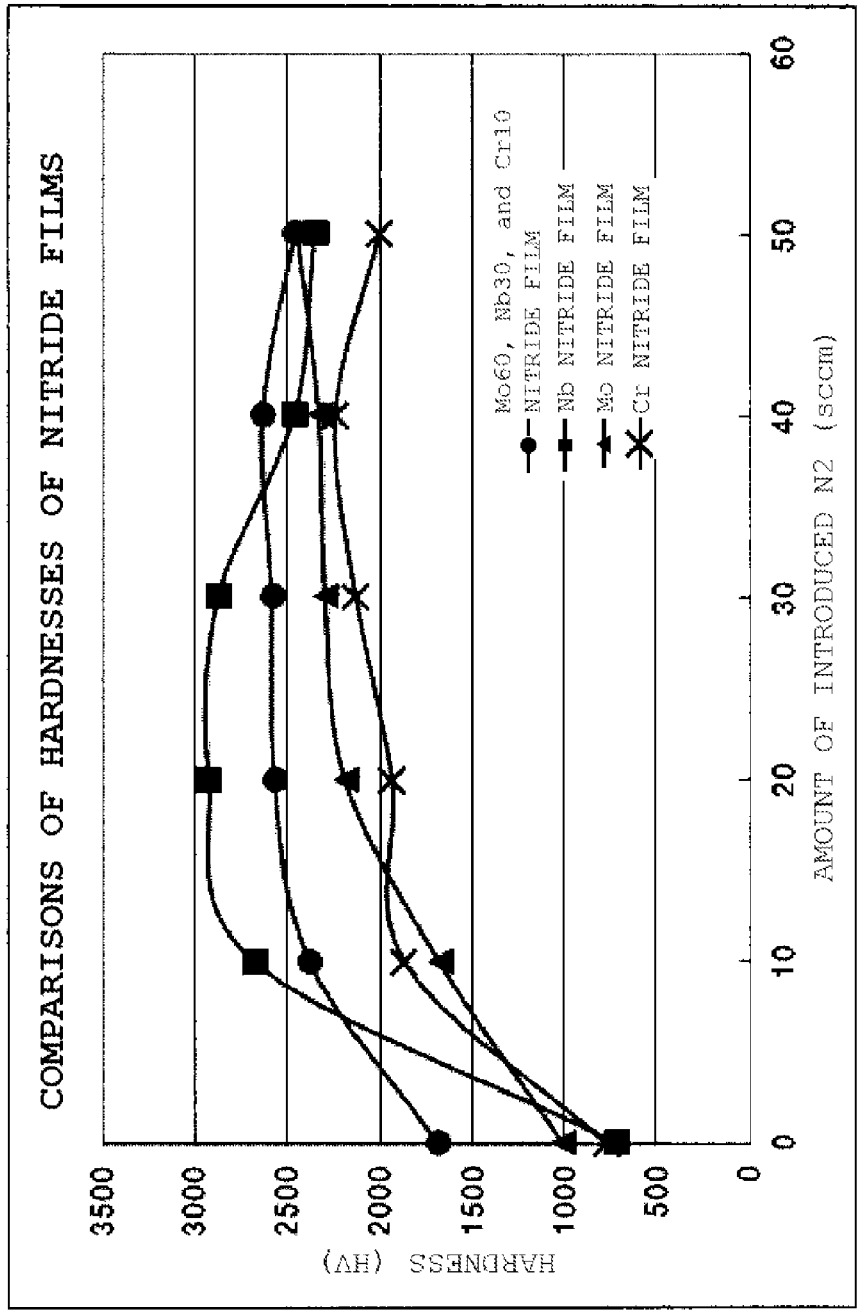
FIG. 19 is a view of a comparison of the film hardnesses of a rigid nitride film 62, a Mo nitride film, a Nb nitride film, and a Cr nitride film, produced by changing the amount of nitrogen gas.
Figure 20:
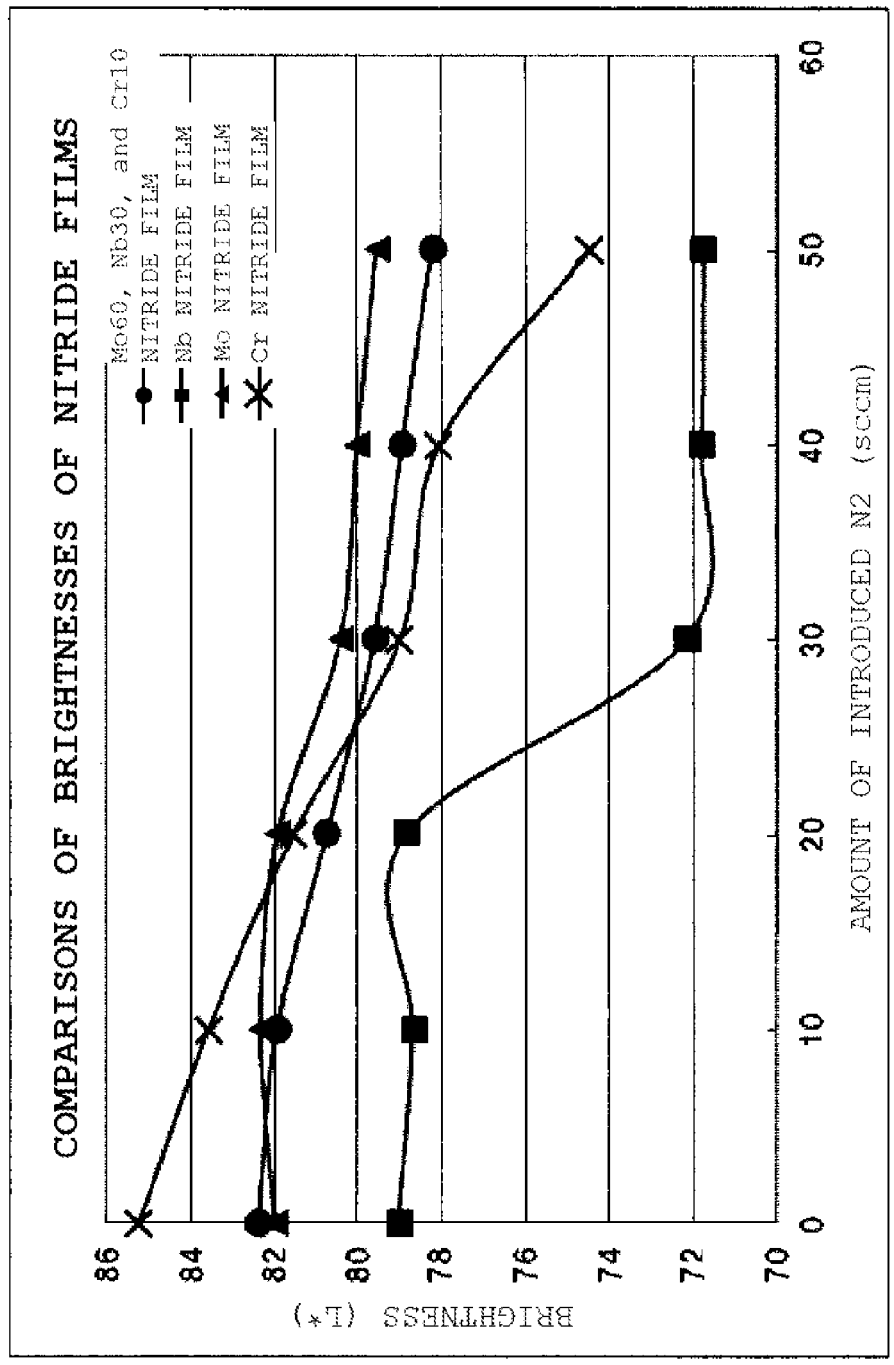
FIG. 20 is a view of a comparison of the brightnesses of the rigid nitride film 62, the Mo nitride film, the Nb nitride film, and the Cr nitride film, produced by changing the amount of nitrogen gas.
Figure 21:
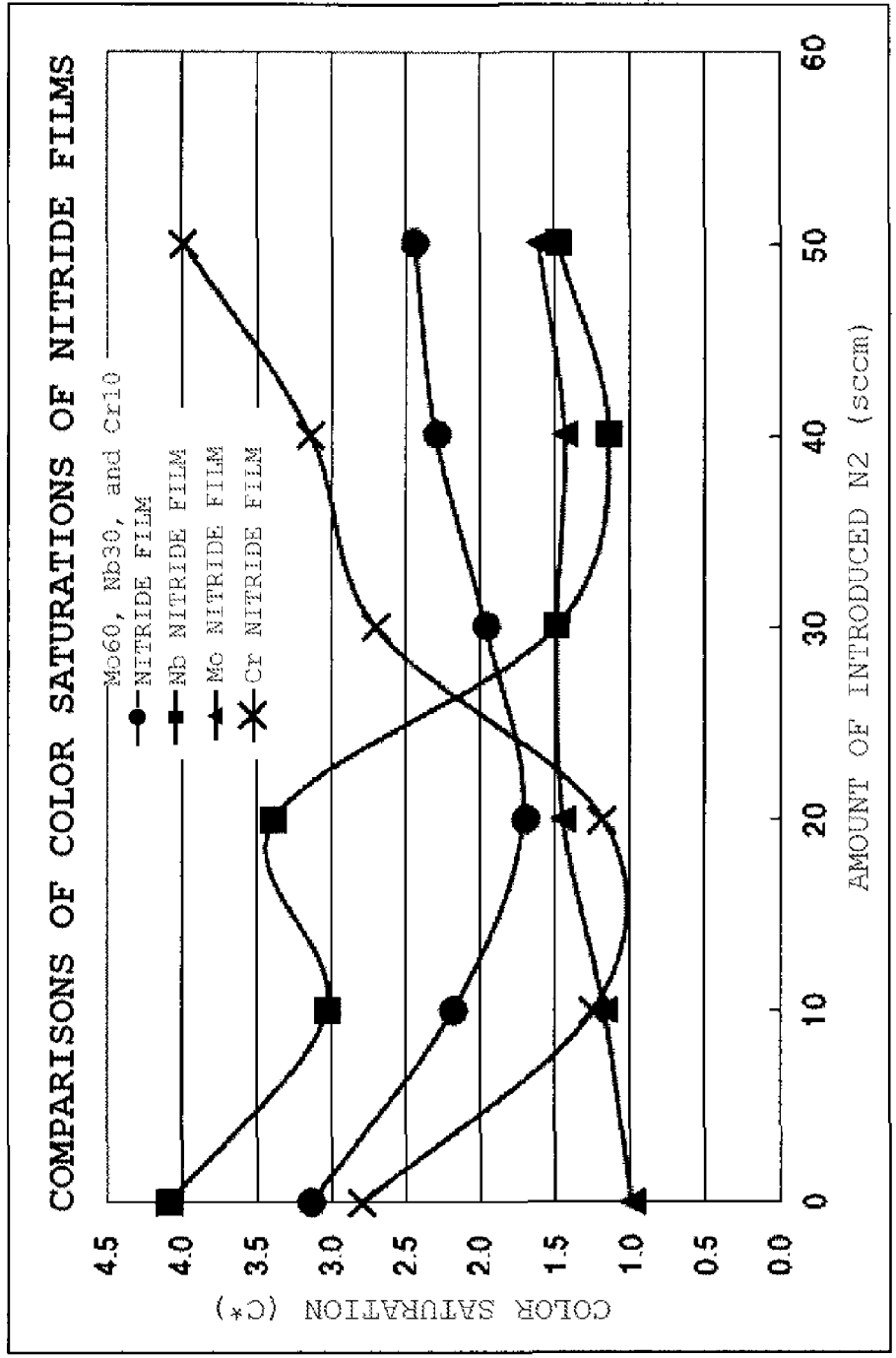
FIG. 21 is a view of a comparison of the color saturations of the rigid nitride film 62, the Mo nitride film, the Nb nitride film, and the Cr nitride film, produced by changing the amount of nitrogen gas.

FIG. 18 is a cross-sectional schematic view of a rigid decorative member 60, FIG. 19 is a view of comparisons of the film hardnesses of a rigid carbide film 62 (rigid coating layer), a Mo nitride film, a Nb nitride film, and a Cr nitride film, which were produced by changing the amount of nitrogen gas, FIG. 20 is a view of comparisons of the brightnesses of the rigid carbide film 62, the Mo nitride film, the Nb nitride film, and the Cr nitride film, which were produced by changing the amount of nitrogen gas, FIG. 21 is a view of comparisons of the color saturations of the rigid carbide film 62, the Mo nitride film, the Nb nitride film, and the Cr nitride film, which were produced by changing the amount of nitrogen gas, Table 7 is a table of comparisons of maximum hardness, corrosion resistance performance, and etching performance in the case of changing the proportions of Mo, Nb, and Cr, and Table 8 is a table of comparisons of corrosion resistance and an etching property in the case of adding Cr, Ti, Hf, and Zr to a MoNb alloy.

(5-1) A sintered body of 60 wt % Mo, 30 wt % Nb, and 10 wt % Cr as the composition of a sputtering target of Example 5 was used. A Class 2 titanium material specified by JIS was used as a base 61, and a MoNbCr alloy nitride film of 2.0 μm was formed on the base 61 by introducing 20 sccm of nitrogen gas under a constant Ar gas amount of 105 sccm by a sputtering method.

(5-2) FIG. 19 represents a view of the comparisons of the film hardness of the MoNbCr alloy nitride film produced by changing the amount of nitrogen gas with those of the Mo nitride film, the Nb nitride film, and the Cr nitride film. The hardness of the MoNbCr alloy nitride film is found to exhibit obviously high hardness compared to those of the Mo nitride film and the Cr nitride film and to also exhibit high hardness that bears comparison with that of the Nb nitride film.

Since the scratch resistance performance is determined generally by the product of the hardness of the abrasion-resistant layer, the film thickness of the abrasion-resistant layer, the degree of adhesion to the base, and the hardness of the base, it is preferable to thickly form the film under the condition of the highest hardness. Therefore, the use of the conditions of the maximum hardness of the Nb nitride film is superior to the MoNbCr alloy nitride film from the viewpoint of film hardness; however, since the Nb nitride film has high film stress and also have poor adhesion to a substrate, the film having a film thickness of only around 1.0 μm can be formed. Conversely, since the Mo nitride film and the Cr nitride film have low film stress and high adhesion to the substrate, peeling or the like does not occur even when the film of 3.0 μm or more is formed; however, since the film has low film hardness, it is impossible to obtain high scratch resistance performance. Since the MoNbCr alloy nitride film has the characteristics of all of Mo, Nb, and Cr, the film has high hardness and also has high adhesion to the base, therefore, the peeling of the film or the like does not occur even when the film of 2.5 μm or more is formed, and high scratch resistance performance is thus obtained.

FIG. 20 is a view of comparisons of the brightnesses of the films produced by changing the amount of nitrogen gas in the MoNbCr alloy nitride film. The brightness of the MoNbCr alloy nitride film exhibited obviously high brightness compared to the Nb carbide film and exhibited high brightness that bears comparison with the high brightnesses of the Mo nitride film and the Cr nitride film.

Examples of performances demanded in exterior parts include brightness. This is because higher brightness results in a higher grade. A white decorative member having a brightness (L*) of 78 or more is generally desired, and judging from the results of FIG. 19, the Nb nitride film has a brightness L* of less than 78, therefore, the Nb nitride film is almost gray rather than white, and a higher grade is not obtained. In the MoNbCr alloy nitride film, high brightness can be obtained by alloying Mo and Cr. In addition, in order to increase the brightness, the brightness can be freely adjusted by increasing the proportions of contained Mo and Cr.

FIG. 21 is a view of comparisons of the color saturations (C*) of the films produced by changing the amount of nitrogen gas in the MoNbCr alloy nitride film. The color saturation of the MoNbCr alloy nitride film exhibited a behavior according to the proportions of the alloyed metals and indicated a constant, low value in any nitrogen gas range. Since a color saturation (C*) that is closer to zero (0) is better in the case of a white color, the white decorative member on which the MoNbCr alloy nitride film of Example 5 is formed is found to have a white color compared to the Nb nitride film and the Cr nitride film. Further, the Cr nitride film had a slightly brown-tinted color tone with increasing the amount of nitrogen gas, while the MoNbCr alloy nitride film, in which increase of C* was suppressed, presented a constant, white color even when the amount of nitrogen gas was increased. The color saturation can also be freely adjusted by the proportion of Mo, Nb, and Cr.

(5-3) In Table 7, the hardnesses of a carbide film and a nitride film, corrosion resistances, etching properties, and overall evaluations are listed with respect to MoNbCr alloy proportions. In other words, rigid decorative members having nitride films were produced in the same manner as in (5-1) except that sintered bodies of which the proportions of Mo, Nb, and Cr are listed in Table 7 were used as sputtering targets. A test for the corrosion resistances and etching properties of the rigid decorative members was conducted.

In addition, rigid decorative members having a nitride film and a carbide film were produced by changing the kind and amount of gas. In the case of the nitride film, plural samples were produced by changing the amount of introduced nitrogen gas between 5 sccm and 60 sccm under a constant Ar gas amount of 105 sccm. In the case of the carbide film, plural samples were produced by changing the amount of introduced methane gas between 5 sccm and 60 sccm under a constant Ar gas amount of 105 sccm. The maximum hardnesses of the rigid hard decorative members were determined. The maximum hardness of the nitride film in Table 7 is the hardness of the nitride film exhibiting the maximum value when the hardness of each nitride film produced by changing the amount of reaction gas is measured. The same also applies to the maximum hardness of the carbide film.

When a test for the corrosion resistance and etching properties of the rigid decorative members having the carbide film produced using sintered bodies of MoNbCr alloy was also conducted, the corrosion resistance and the etching properties were excellent in the same manner as in the case of the nitride film.

As listed in Table 7, the maximum hardness, the corrosion resistance, and the etching property are found to be changed depending on the alloy proportion and can be freely adjusted by the alloy proportion. The higher proportions of Mo and Cr are advantageous for scratch resistance because of resulting in increased brightness and also in improved adhesion to a base, and of enabling a film to be thick; however, in the case of single Mo, corrosion resistance is poor in a CASS test, and application as a decorative member is impossible. In the case of single Nb, corrosion resistance to an alkali is poor and adhesion to the base is also poor, it is thus impossible to form a thick film, and therefore, the single use is impossible. Further, the high proportion of Nb results in higher film hardness and are advantageous for scratch resistance but result in low brightness, and therefore application as a decorative member is impossible. The case of single Cr is disadvantageous for scratch resistance because of resulting in low film hardness although resulting in excellent adhesion and excellent corrosion resistance and has a drawback that etching is impossible in the single Cr since corrosion resistance is high. Anticorrosion performance, particularly corrosion resistance performance to a hypochlorite can be greatly improved by adding a slight amount of Cr in the same manner as in Example 5. Alloying of Mo, Nb, and Cr enables the drawback of each of brightness, corrosion resistance, adhesion, and film hardness to be compensated.

For obtaining a white rigid decorative member excellent in the balance of a color tone, scratch resistance, and an anticorrosion property, the proportion of Mo is desirably 20 wt to 80 wt %, more desirably 30 to 70 wt %.

A higher Cr proportion is effective for use as a white rigid decorative member having a high-grade color sense and excellent anticorrosion performance; however since the excessively high proportion of Cr results in greatly deteriorated etching performance and the excessively high proportion of Cr with low film hardness results in greatly deteriorated scratch resistance performance, the proportion of Cr is desirably in an experimental range of 0.5 wt to 30 wt %, more desirably 0.5 to 20 wt %.

TABLE 7

| Proportion of Mo (wt %) | Proportion of Nb (wt %) | Proportion of Cr (wt %) | Carbide Film Maximum Hardness | Nitride Film Maximum Hardness | Corrosion Resistance CASS 48 h | Artificial Sweat 48 h | Alkali | Resistance to Hypochlorous Acid 1% | 3% | 6% | Etching Property (1 μm) Hot Nitric Acid | Hot Nitric Acid + Fluorinated Acid | Overall Evaluation |
|---|---|---|---|---|---|---|---|---|---|---|---|---|---|
| 100 | 0 | 0 | 2535 | 2331 | Poor | Good | Good | Poor | Poor | Poor | 300 sec | 35 sec | Poor |
| 0 | 100 | 0 | 3151 | 2920 | Good | Good | Fair | Good | Fair | Poor | Poor | 430 sec | Fair |
| 0 | 0 | 100 | 1659 | 2243 | Good | Good | Good | Good | Good | Good | Poor | Poor | Good |
| 60 | 30 | 10 | 2714 | 2631 | Good | Good | Good | Good | Good | Good | Poor | 1200 sec | Good |

Since Cr is a material exhibiting an allergic property in the human body, caution for a metal allergy is needed when Cr is used in exterior parts of watches and ornaments such as glasses and accessories. Accordingly, for an application in which the caution for a metal allergy is needed, it is preferable to use Ti, Hf, or Zr other than Cr or to use an alloy of (Mo, W) and (Nb, Ta) without using Cr, Ti, Hf, or Zr.

(5-4) In Table 8, the corrosion resistance, etching property, and overall evaluation of a MoNb alloy film, in which 10 wt % of Ti, Hf, or Zr instead of Cr in Example 5 was alloyed, are listed. In other words, rigid decorative members were produced in the same manner as in (5-1) except that sintered bodies in which the proportions of Mo, Nb, Ti, Hf, and Zr are listed in in Table 8 were used as sputtering targets. Corrosion resistance, particularly corrosion resistance to hypochlorous acid is improved by alloying a Group 4 material such as Ti, Hf, or Zr in the same manner as in the case of Cr. However, since the material such as Ti, Hf, or Zr is a material having low brightness, the increased proportion of the contained material results in significantly decreased brightness and prevents a high grade from being obtained. Since formation of a nitride film with an alloy in which the proportion of contained Ti, Hf, or Zr results in slight coloring and prevents a high-grade white color from being obtained, the proportion of contained Ti, Hf, or Zr is desirably in an experimental range of 0.5 wt to 20 wt %, more desirably 0.5 to 10 wt %.

TABLE 8

| Alloy Proportion (60 wt % Mo and 30 wt % Nb) | Corrosion Resistance | | | Resistance to | | | Etching Property (1 μm) | | Overall Evaluation |
|---|---|---|---|---|---|---|---|---|---|
| | CASS 48 h | Sweat 48 h | Alkali | Hypochlorous Acid 1% | 3% | 6% | Hot Nitric Acid | Hot Nitric Acid + Fluorinated Acid | |
| 10 wt % Cr | Good | Good | Good | Good | Good | Good | Poor | 1200 sec | Good |
| 10 wt % Ti | Good | Good | Good | Good | Good | Fair | Poor | 160 sec | Good |
| 10 wt % Hf | Good | Good | Good | Good | Good | Fair | Poor | 160 sec | Good |
| 10 wt % Zr | Good | Good | Good | Good | Fair | Poor | Poor | 100 sec | Good |

In (1-2), (2-2), (3-2) (4-2), and (5-2) of Examples 1 to 5, the rigid decorative members produced by introducing no reactive gas correspond to the example of Embodiment (2).

Mo, W, and Cr have high adhesion to a base, and Mo and Cr are materials particularly having high brightness. However, Mo and Cr do not have high film hardness and do not offer high scratch resistance. Further, Mo is significantly poor in corrosion resistance performance. Nb and Ta are materials having high film hardness and also high corrosion resistance; however, Nb and Ta do not offer a high grade for a decorative member because of having low adhesion to a base and also low brightness. Further, Cr is one of materials having the highest corrosion resistance performance in the materials. In the present invention, the production of the alloy enables the advantages and disadvantages the metals to be each complemented, and a rigid decorative member that has a high-grade color sense and is particularly excellent in scratch resistance and an anticorrosion property for a long term, to be provided. It is easy to make a film in which two or more of Mo, W, Nb, Ta, and Cr (Ti, Hf, Zr) are alloyed, so that film hardness, a color tone, corrosion resistance, adhesion, and the like can be freely controlled, and scratch resistance can be significantly improved. The nitrides, carbides, oxides, oxynitrides, oxycarbides, carbonitrides, and oxynitrocarbides of the alloys can also be easily produced by adjusting a reactive gas and can be changed depending on a desired property.

As described above, in the white rigid decorative member of the present invention, since a film with an alloy of a metal having the high effect of adhesion to a metal and high brightness, a metal having high film hardness and high corrosion resistance, and a metal adjusting allergy performance is formed on or above a base, adhesion between the base and the film is improved, the film can be thickly formed, and therefore scratch resistance can be improved. In addition, since film hardness, scratch resistance, a color tone, corrosion resistance, adhesion, and an etching property can be freely controlled by an alloy proportion, and allergy performance can also be further adjusted, a decoration part having all of high scratch resistance performance that is not able to be obtained in the conventional art, as well as a high grade and high corrosion resistance for ornaments and decorative trims can be obtained.

INDUSTRIAL APPLICABILITY

The present invention is to provide a white rigid decorative member in which deterioration of appearance quality due to a scratch, abrasion, or the like is suppressed, and which has a high-grade color tone. Furthermore, the present invention can be utilized in decorative members for exterior parts of watches, ornaments such as glasses and accessories, decorative trims, Sporting goods, and the like since a color tone, anticorrosion performance, etching performance, and allergy performance can be freely controlled.

REFERENCE SIGNS LIST 10, 20, 30, 40, 50, 60: Rigid decorative member
11, 21, 31, 41, 51, 61: Base
12: Rigid coating layer
22, 32, 42: Rigid carbide film layer
52, 62: Rigid nitride film layer

The invention claimed is:

1. A rigid decorative member comprising a base and a rigid coating layer laminated on or above the base, wherein
    the rigid coating layer comprises a reaction compound of (i) raw metal, in which a metal M1 and a metal M2 and optionally a metal M3 are combined, and (ii) a non-metallic element selected from one or two of nitrogen and carbon, or comprises an alloy in which a metal M1 and a metal M2 and optionally a metal M3 are combined;
    the metal M1 is selected from one or two of Mo and W;
    the metal M2 is selected from one or two of Nb and Ta; and the metal M3 is selected from one or two or more of Cr, Ti, Hf, and Zr.

2. The rigid decorative member according to claim 1, wherein the raw metal is a raw metal in which the metal M1 and the metal M2 are combined with the metal M3; and the metal M3 is Cr.

3. The rigid decorative member according to claim 1, wherein 70 mass % or more in total of the metal M1 and the metal M2 is contained in the raw metal.

4. The rigid decorative member according to claim 1, wherein the rigid coating layer has a thickness of 0.5 to 4μm.

5. The rigid decorative member according to claim 1, wherein the appearance color of the rigid coating layer is a white color or a stainless steel color.

6. The rigid decorative member according to claim 1, wherein an undercoat layer is further laminated between the base and the rigid coating layer, or a finishing layer is further laminated on or above the rigid coating layer.

7. A watch comprising an exterior part, wherein a portion or the entirety of the exterior part comprises the rigid decorative member according to claim 1.

8. A method for producing a rigid decorative member, comprising laminating a rigid coating layer on or above a base, wherein
    the rigid coating layer comprises a reaction compound of (i) raw metal, in which a metal M1 and a metal M2 and optionally a metal M3 are combined, and (ii) a non-metallic element selected from one or two of nitrogen and carbon, or comprises an alloy in which a metal M1 and a metal M2 and optionally a metal M3 are combined;

the metal M1 is selected from one or two of Mo and W; the metal M2 is selected from one or two of Nb and Ta; and the metal M3 is selected from one or two or more of Cr, Ti, Hf, and Zr.

9. The method for producing a rigid decorative member according to claim 8, wherein the raw metal is an alloy in which a metal M1 and a metal M2 and optionally a metal M3 are combined; and the rigid coating layer is laminated on or above the base by a reactive sputtering method.

* * * * *